United States Patent [19]

Maeda et al.

[11] Patent Number: 5,422,598
[45] Date of Patent: Jun. 6, 1995

[54] HIGH-FREQUENCY POWER AMPLIFIER DEVICE WITH DRAIN-CONTROL LINEARIZER CIRCUITRY

[75] Inventors: Tadahiko Maeda; Koji Iino, both of Yokohama; Shuichi Obayashi; Syuuichi Sekine, both of Urayasu, all of Japan

[73] Assignee: Kabushiki Kaisha Toshiba, Kawasaki, Japan

[21] Appl. No.: 174,265

[22] Filed: Dec. 28, 1993

[30] Foreign Application Priority Data

Dec. 28, 1992 [JP] Japan .................. 4-349524
Jun. 30, 1993 [JP] Japan .................. 5-188861

[51] Int. Cl.⁶ ........................................... H03G 3/30
[52] U.S. Cl. ................................. 330/136; 330/279;
    330/285; 455/116; 455/127
[58] Field of Search ............... 330/128, 129, 136, 141,
    330/149, 279, 281, 285, 290, 296, 297; 455/116,
    126, 127

[56] References Cited
U.S. PATENT DOCUMENTS 3,644,832  3/1972  Sherman, Jr. ................. 330/285 X
4,458,213  7/1984  Quan ............................ 330/296 X

FOREIGN PATENT DOCUMENTS 62-274906  11/1987  Japan .
3-222524   10/1991  Japan .

Primary Examiner—James B. Mullins
Attorney, Agent, or Firm—Oblon, Spivak, McClelland, Maier, & Neustadt

[57] ABSTRACT

A two-stage power amplifier device for use in a digital hand-held radiophone includes a first and a second amplifier circuit. The first amplifier is an exciter-stage amplifier for receiving a high-frequency input signal corresponding to a modulation signal to generate an amplified signal at its output. The second amplifier is a final-stage amplifier connected to either the input signal or the output of the exciter amplifier. A detector circuit is connected to the exciter amplifier, for monitoring variations in a bias current to be fed to the exciter amplifier, and for generating a detection signal indicative of the current variation thus detected. A linearizer circuit is connected to the detector and the final-stage amplifier. The linearizer is responsive to the detection signal, for forcing a bias voltage given to the final-stage amplifier to vary in potential while causing the bias voltage to remain in a univocally determinable relationship with a waveform of said input signal, to thereby increase the linearity of the final-stage amplifier.

19 Claims, 15 Drawing Sheets

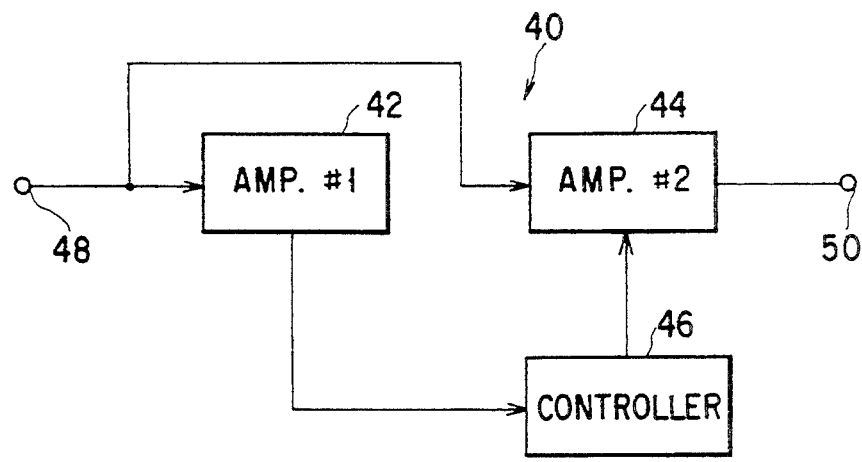
F I G. 1
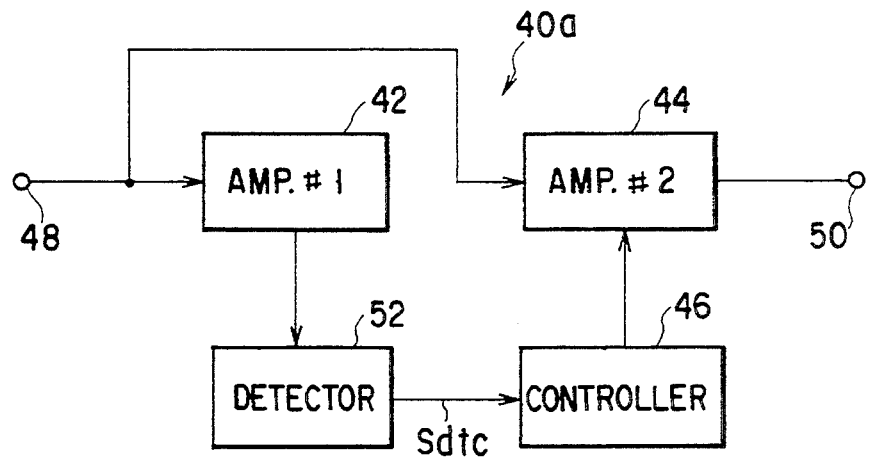
F I G. 2
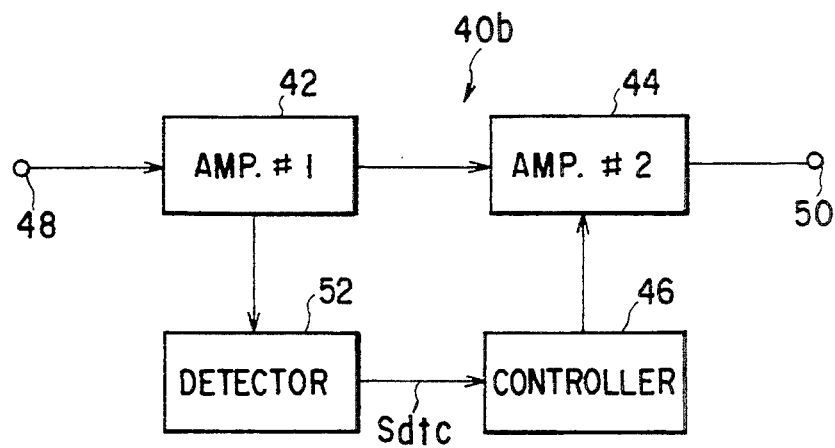
F I G. 3

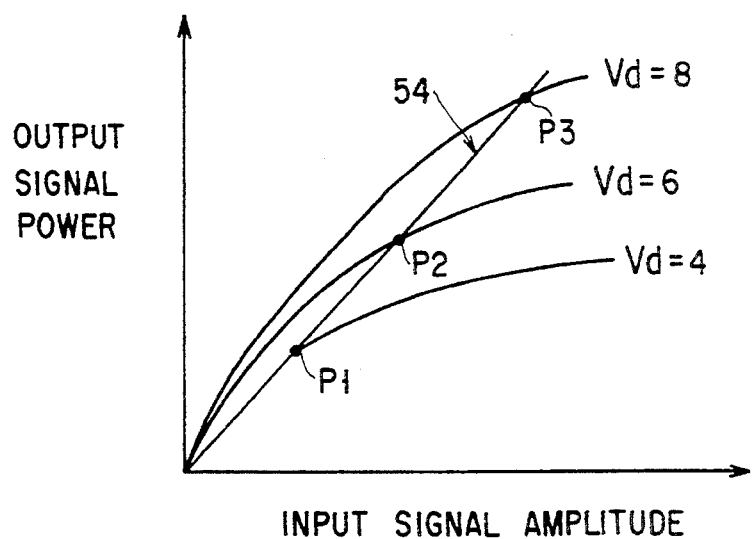
F I G. 4
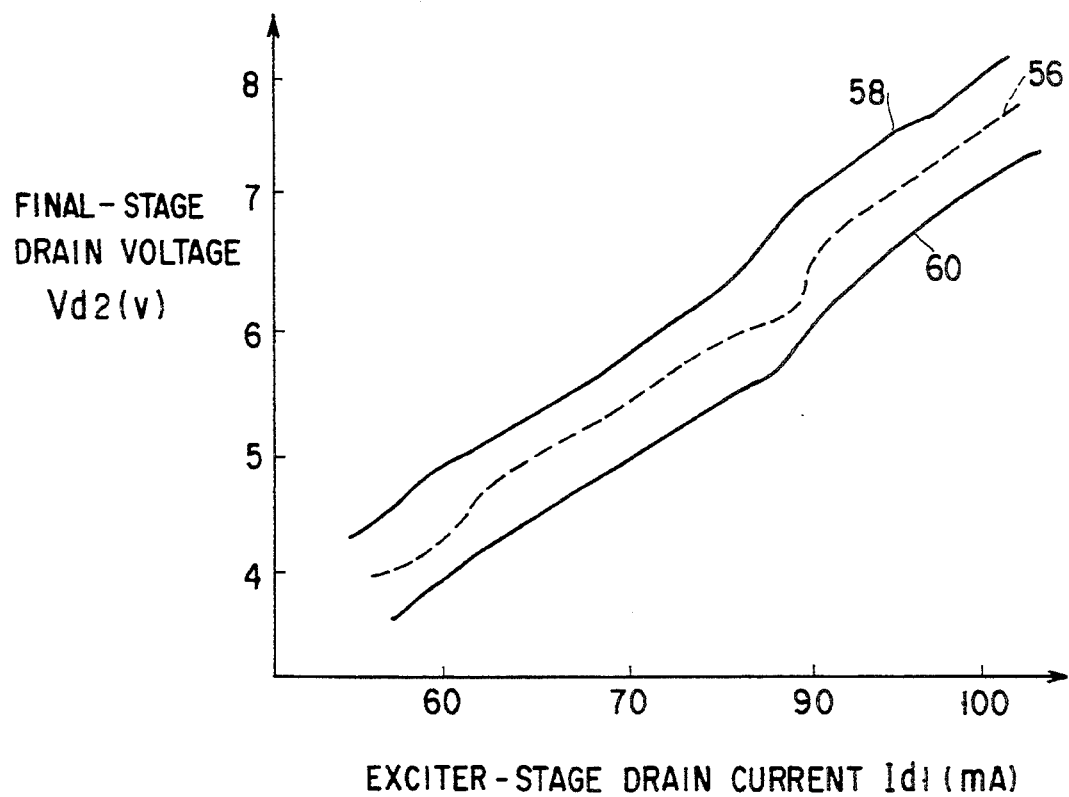
F I G. 5

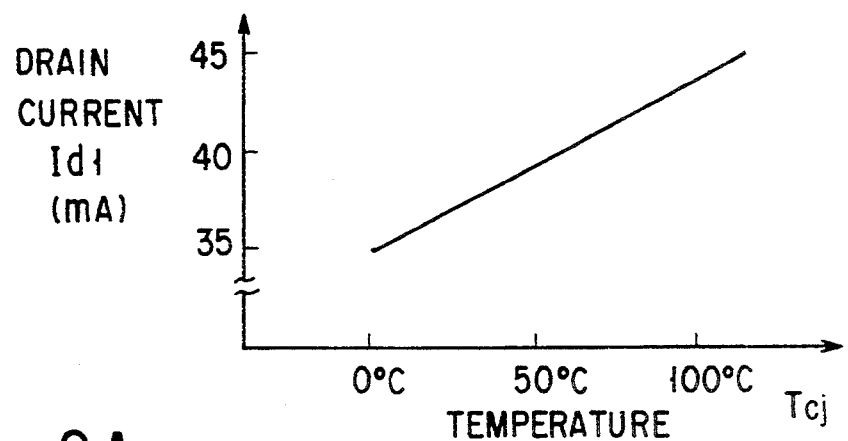
F I G. 9A
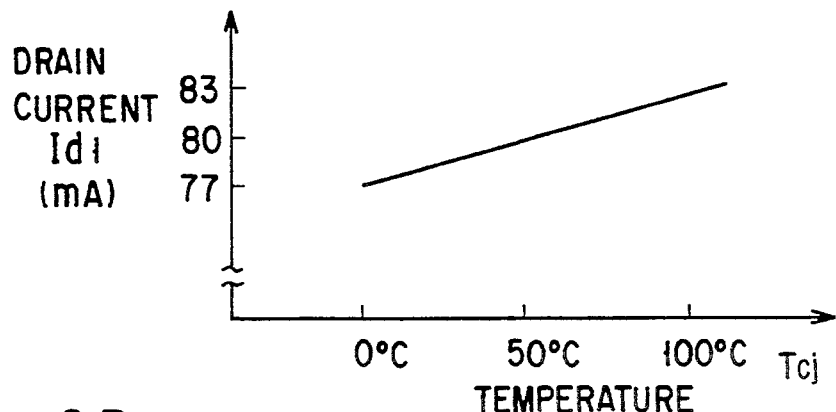
F I G. 9B
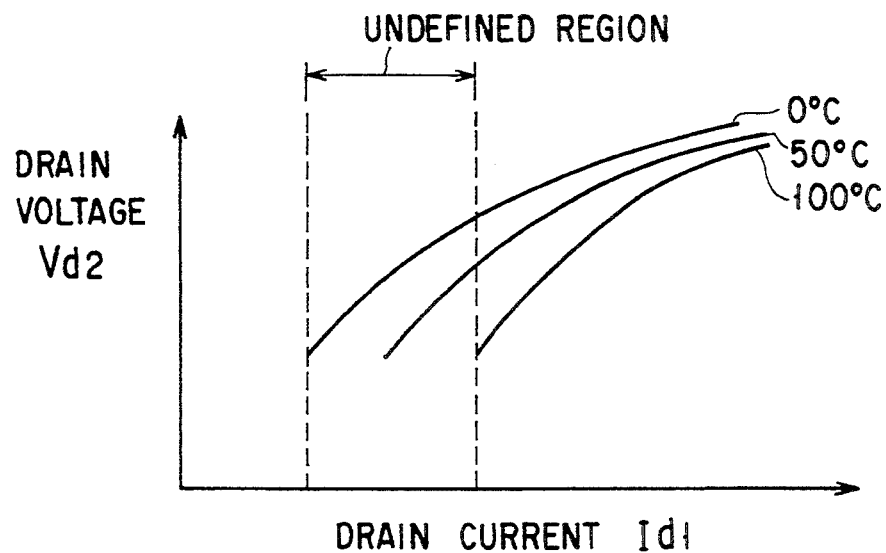
F I G. 10

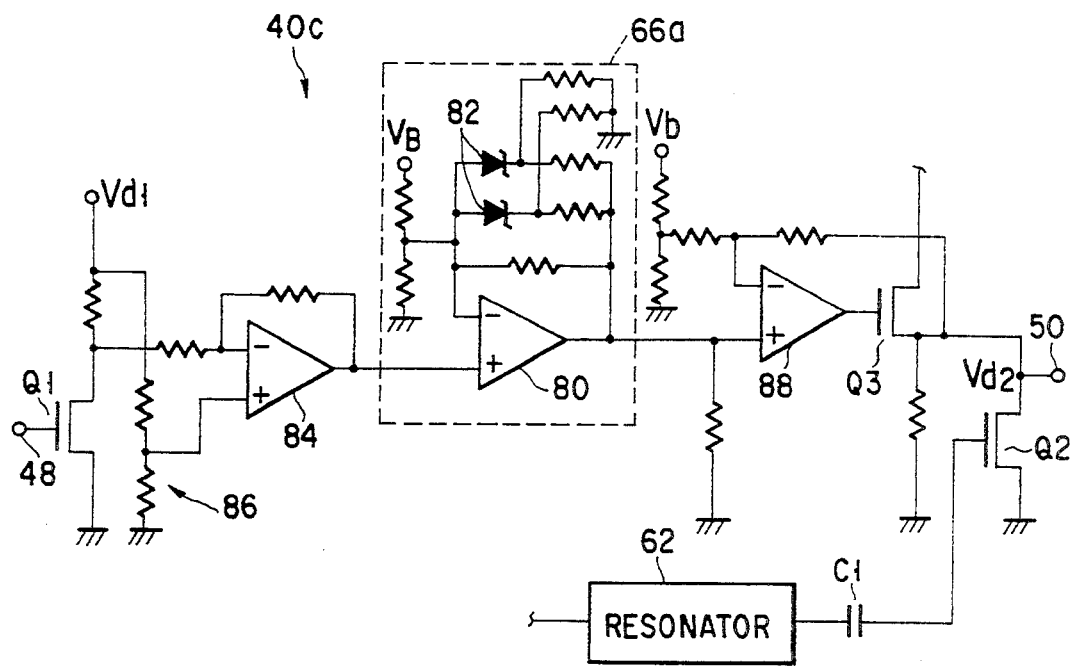
F I G. 11
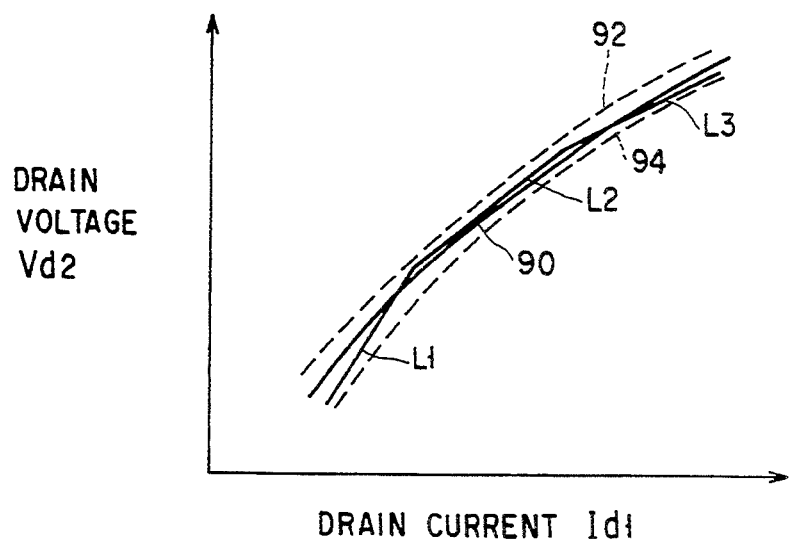
F I G. 12

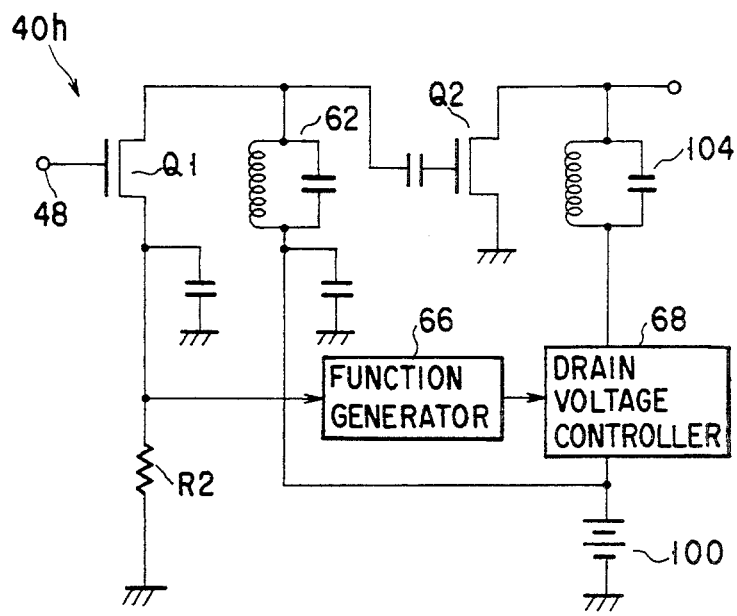
F I G. 20
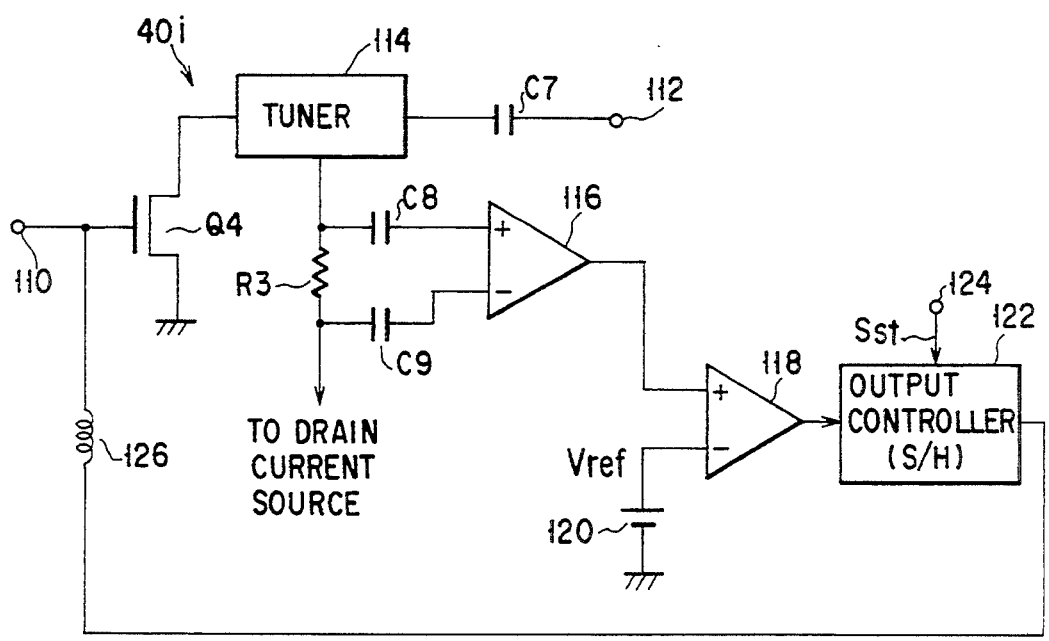
F I G. 21

| SAMPLE | #2 | #3 | #4 | #5 | #6 |
|---|---|---|---|---|---|
| Vgs | -4.3 | -5.0 | -5.0 | -5.0 | -5.1 |
| INTEGRATION VALUE | 2770 | 2678 | 2762 | 2319 | 2762 |

| SAMPLE | #2 | #3 | #4 | #5 | #6 |
|---|---|---|---|---|---|
| INTEGRATION VALUE | 3214 | 4026 | 4035 | 4087 | 4378 |

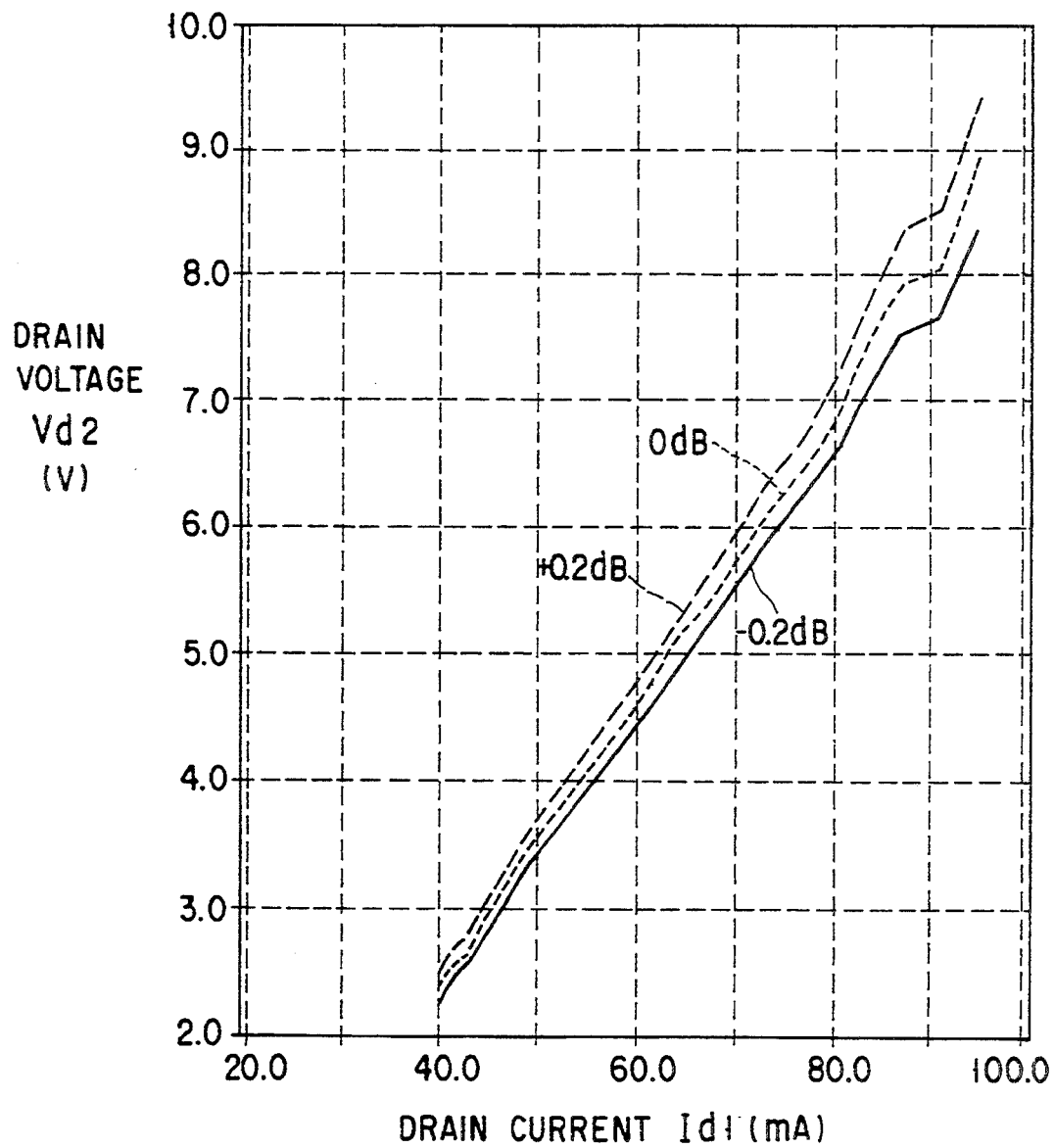
F I G. 26

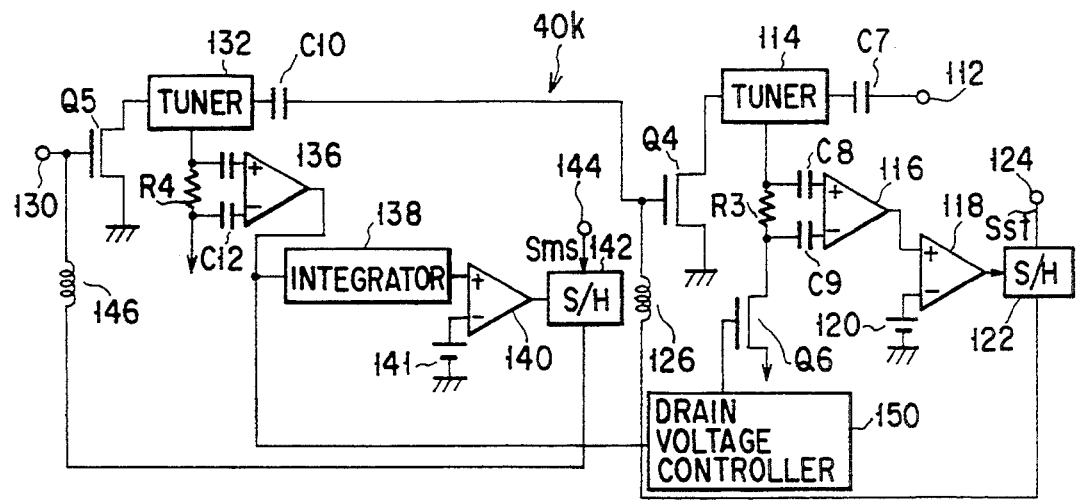
F I G. 27
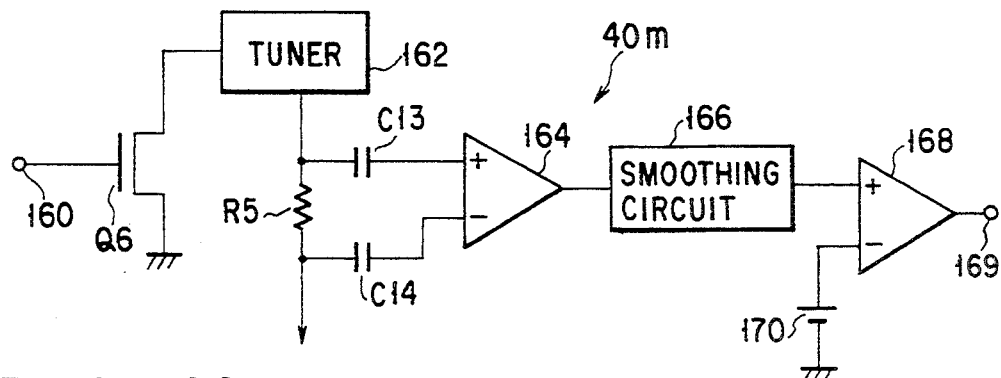
F I G. 29
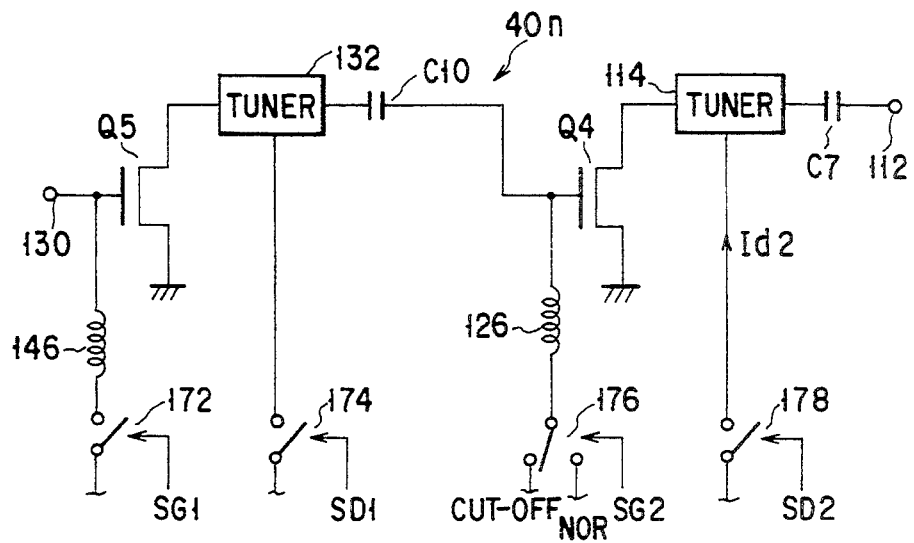
F I G. 30

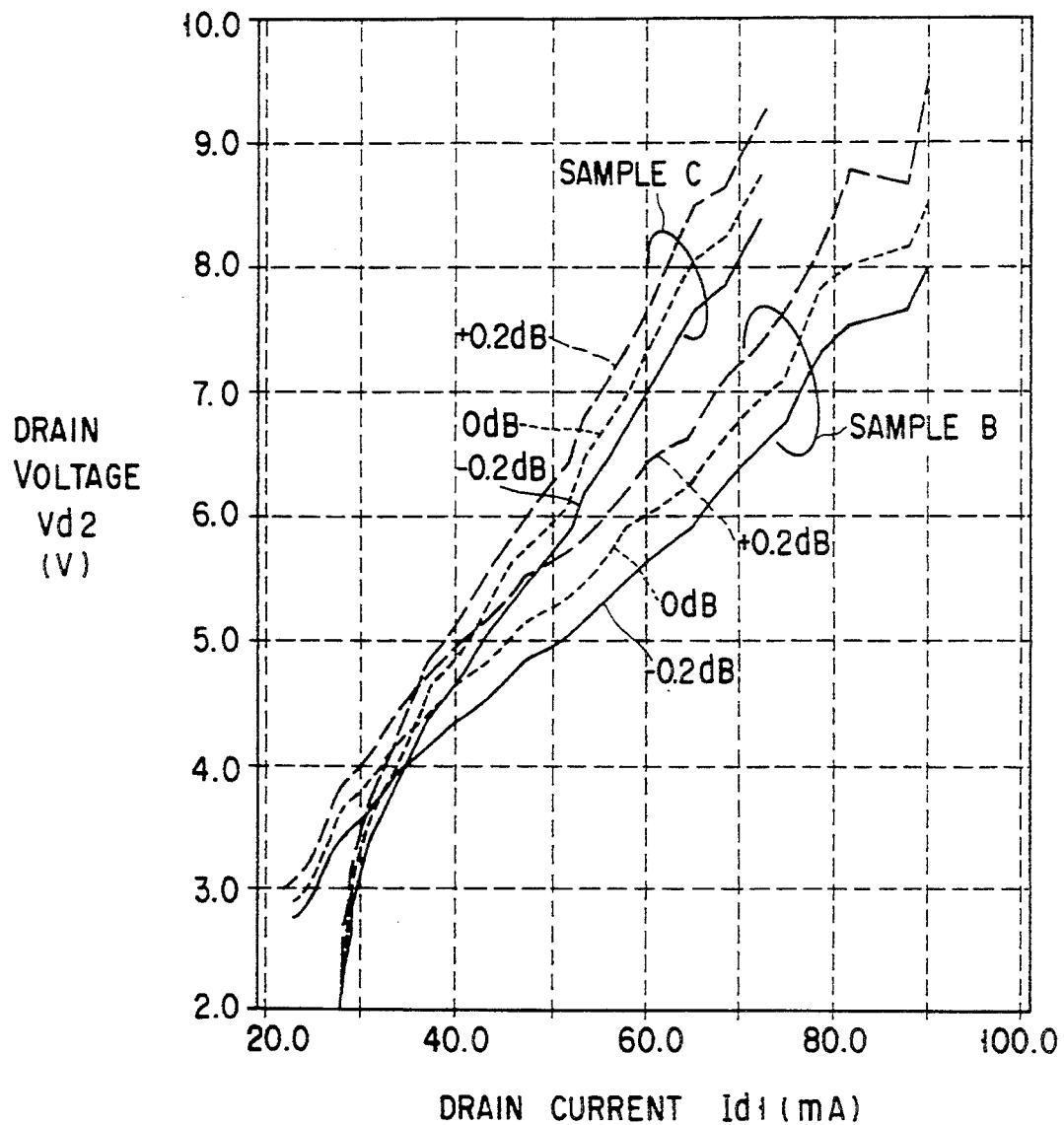
F I G. 28

HIGH-FREQUENCY POWER AMPLIFIER DEVICE WITH DRAIN-CONTROL LINEARIZER CIRCUITRY

BACKGROUND OF THE INVENTION

1. Field of the Invention

The present invention relates generally to power amplifier devices, and more particularly to power amplifier circuits for use in small size electronic equipment such as a radio transmitter in digital radio telephone devices.

2. Description of the Related Art

In recent years, the portable or hand-held radio telephones are becoming more widely used in public telephone communication systems. Such telephones include frequency-modulation radiophones with the increasing needs for high performance and reliability of such hand-held radiophones, development of a small-size power amplifier has been demanded strongly.

Typically, presently available power amplifiers for use in the hand-held FM radiophone transmitters employ high-efficiency C-class power amplifier circuits due to the importance in operation efficiency of them. Some FM radiophone transmitters employ F-class power amplifier circuits, which are inherently excellent in the operation efficiency, in order to achieve further "down-sizing" of radiophones and further extension in talking time period.

The trend of technology may push radiophones to employ the digital modulation scheme, rather than the conventional analog frequency-modulation scheme. Highly advanced digital radiophone transmitters require the employment of specific power amplifier circuits being excellent in linearity characteristic due to the fact that these radiophones are designed to deal with a quadrature phase shift keying (QPSK) modulation signal, which is one of digitally modulated electrical audio signals. In other words, the digital radiophones are strongly demanded to attain an improved linearity in addition to the achievement of higher operation efficiency as has been conventionally required in the analog FM radiophones. There is a trade-off between the improvement of efficiency and the enhancement of linearity: To improve the efficiency, the power amplifiers by themselves are so designed as to operate in the saturation region; this may force the amplifiers to operate in a non-linear manner, with the result in the amplifiers being degraded in linearity.

To overcome the conflicting problems, a linearity compensator circuit for power amplifiers has been proposed. Such circuit is called the "linearizer." Conventionally, different approaches to the linearity-compensation circuit design have been proposed and studied by various groups. One of such approaches is what is called the "drain-control" linearization technique, as will be described below.

A "drain-control" linearizer is disclosed, for example, in Published Unexamined Japanese Patent Application (PUJPA) 3-104422 (FIG. 4). The linearizer may alternatively be called the "drain-controlled" linearizer in some cases. A power amplifier circuit is provided with a power supply control circuit connected to a converter providing the analog-to-digital conversion for an incoming QPSK signal. The digital-to-analog converter has an input connected to a semiconductor read-only memory (ROM) device, which stores therein digital values predetermined in accordance with the input/output characteristic of the power amplifier. The ROM has a first input connected to an inphase (I) component of the incoming QPSK signal, and a second input coupled to a quadrature (Q) component of the QPSK signal forming the vector QPSK waveform. In response to presently supplied "I" component and "Q" component, a digital value is read out of the ROM, which value suitably corresponds to the amplitude of the envelope of an input signal. The digital value thus read is then converted by the digital-to-analog converter into a corresponding analog signal. The analog signal is supplied to the control circuit as a control signal. The control circuit controls the power supply voltage of the power amplifier (that is, the drain voltage of a field effect transistor therein) so that the input-to-output characteristic of the amplifier is linearized to provide an enhanced linearity.

With such a prior-art power amplifier device, in principle, the enhancement of linearity of power amplifier does not come without accompanying penalties such as a complication of circuit configuration and a decrease in the signal-to-noise ratio. The presence of intervening digital-to-analog converter may increase necessary circuit components in number, so that the circuit is complicated as a whole. This is the contrary to the down-sizing requirement for radiophones. In addition, the digital-to-analog converter is a "power-eater" that consumes much power, causing the radiophone to increase in the power consumption as a whole. This is a bar to the achievement of an increased talking time length using the radiophone.

There is a more serious problem: The presence of digital signals behaves badly to accelerate the occurrence of noises within the circuit, causing the output audio signals sent forth or transmitted externally to decrease in quality. The noise problem will become much serious in particular in the case of broad-band power amplifiers of higher data transmission ratio. The noise problem may be solved to some extent by arranging the device so that an input signal amplitude detection section serving as a noise generator is located at an increased distance far from the power supply control section; however, in such a case, it will no longer be expected to accomplish successful control that is essential to the operation stability of the power amplifier, such as the temperature compensation.

Moreover, with the prior art, it should be required that information on the non-linear input-to-output characteristic of the power amplifier is prestored in the ROM. Access to the ROM contents is done depending upon an input QPSK signal externally supplied thereto. This necessitates that the power amplifier device is so designed as to form a pair with a modulator; it is not permissible that these circuits are freely located at different positions. Such layout limitation makes it impossible for the power amplifier device to operate independently in a self-supporting or "self-reliance" fashion, which limits extremely the flexibility of the circuit design.

Another drain-control linearizer is disclosed, for example, in PUJPA 63-164631 (FIG. 1). This prior-art device may be similar to the above power amplifier device with the ROM being arranged to have an input connected to the output of an analog-to-digital converter, which is interconnected at its input to a directional coupler by way of a radiowave detector. The coupler subdivides an incoming signal into first and second signal components, one of which is supplied to the input of a power amplifier circuitry, and the other of which is given to an RF-signal detector.

With the prior art, adding an increased number of extra circuit components serves to enlarge the demerits as described previously. In addition to this, the achievement of down-sizing becomes more difficult. This is due to the fact that the employment of the directional coupler does never allow that an input signal detection section including the coupler and a power amplifier section are packed onto the same substrate. This makes it further difficult to attain suitable temperature compensation.

SUMMARY OF THE INVENTION

It is therefore an object of the present invention to provide a new and improved power amplifier circuitry.

It is another object of the invention to provide a new and improved power amplifier device which can exhibit an enhanced linearity while having the operation efficiency excellent.

It is a further object of the invention to provide a new and improved power amplifier device for use in small-size hand-held radio telephones, which device can exhibit an enhanced linearity while having the operation efficiency excellent.

In accordance with the above objects, the present invention is drawn to a specific power amplifier device, which includes a first amplifier for receiving an input signal, and a second amplifier associated with said first amplifier. A controller is provided connected to the first and second amplifiers, for detecting variations in a power supply current fed to the first amplifier, and for controlling a power supply voltage being supplied to the first amplifier in accordance with a current variation as presently detected.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a diagram showing a power amplifier device in accordance with one preferred embodiment of the invention.

FIGS. 2 and 3 show power amplifiers also embodying the invention.

FIG. 4 is a graph showing the input/output characteristic of a power-supply voltage controller circuit included in one of the embodiments of FIGS. 1–3.

FIG. 5 is an experimental graph showing the characteristic of excitation-stage drain current versus final-stage drain voltage of the FIGS. 1–3 embodiments.

FIGS. 7, 8, 9A, 9B and 10 show several characteristics of the FIG. 6 embodiment.

FIG. 11 is a diagram showing a power amplifier device in accordance with a further embodiment of the invention.

FIG. 12 shows the function characteristic of an analog function generator in the FIG. 11 embodiment.

FIGS. 16–20 show some modifications of the power amplifier device.

FIG. 21 is a diagram showing a power amplifier device in accordance with a further embodiment of the invention.

FIGS. 24A, 24B, 25A, 25B and 26 are experimental characteristic diagrams for demonstrating the significance of the FIG. 23 embodiment.

FIG. 27 shows the combined circuit configuration of the embodiments of FIGS. 21 and 23.

FIG. 28 is the drain voltage versus drain current characteristic diagram in connection with the FIG. 27 embodiment.

FIGS. 29, 30 and 32 show the main parts of power amplifier devices also embodying the invention.

DETAILED DESCRIPTION OF THE PREFERRED EMBODIMENTS

Figure 6:
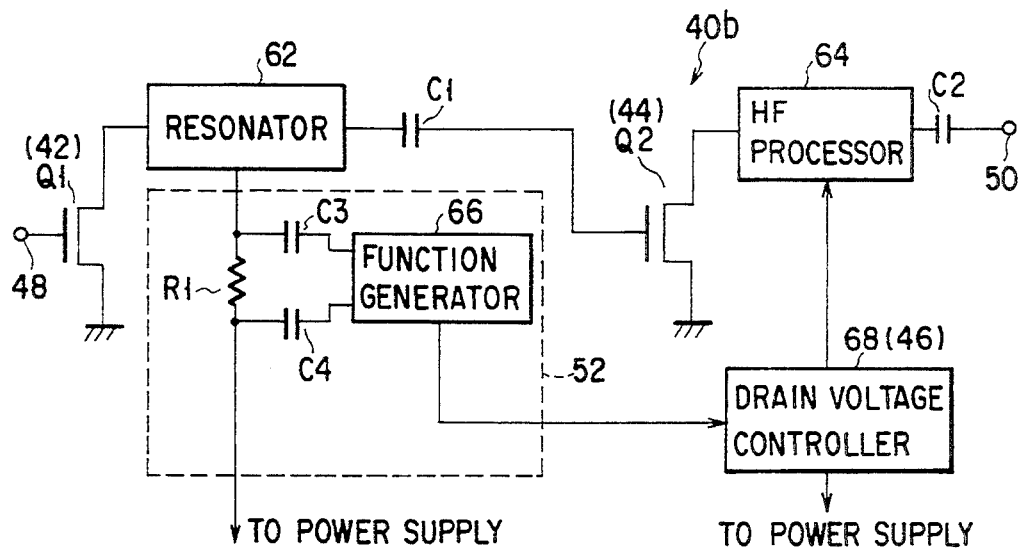
FIG. 6 shows the detailed circuit configuration of the FIG. 3 embodiment.

Referring now to FIG. 1, a power amplifier device for use in small-size digital portable or hand-held radiophones in accordance with one preferred embodiment of the invention is generally designated by the numeral 40. The power amplifier device 40 includes a first amplifier circuit 42 and a second amplifier circuit 44, which are associated with a power-supply voltage control circuit 46 as will be described below.

The first amplifier 42 has an input connected to an input terminal 48, to which an electrical input signal corresponding to an incoming digitally modulated audio information signal is supplied, which may be a quadrature phase shift keying (QPSK) modulation signal. The second amplifier 44 has an input interconnected to signal input terminal 48, a control input coupled to an output of first amplifier 42 by way of the controller 46, and an output connected to a signal output terminal 50. First amplifier 42 acts as the excitation-stage amplifier, whereas second amplifier 44 serves as the final-stage amplifier.

The input signal arrived at the terminal 48 is divided into two signal components, one of which is supplied to the excitation-stage amplifier 42, and the other of which is transferred to the final-stage amplifier 44. First amplifier 42 has an A-class or AB-class amplifier circuit configuration that may employ either a metal oxide semiconductor field effect transistor (MOSFET) or a bipolar transistor, which is inherently excellent in linearity. Second amplifier 44 has an F-class amplifier circuit configuration, which remains less in linearity than exciter amplifier 42 while the operation efficiency is inherently excellent. The controller 46 detects variations in the power supply current Ips flowing in exciter amplifier 42 (that is, the drain-source current Ids of a MOSFET) to adjust or control the power supply voltage vps of final-stage amplifier 44 in response to the detected results so as to improve the linearity of final-stage amplifier 44.

While the excitation-stage amplifier 42 exhibits an A-class amplification operation, its power supply current Ips (typically, the drain-source current Ids of MOSFET, which will be called the "drain current Id" hereinafter for purposes of simplification) may vary in accordance with the amplitude of the input signal, depending upon the characteristics of the actually employed amplifying device. In particular, in the case where excitation-stage amplifier 42 performs an AB-class operation, the power supply current Ips varies substantially in proportion to the amplitude of input signal. Due to this, it may be possible to linearize the input versus output characteristic of final-stage amplifier 44 by controlling the power supply voltage vps (the MOSFET drain-source voltage Vds, for example) of final-stage amplifier 44 in response to variations in the power supply current Ips of exciter amplifier 42. This results in that a deviation-suppressed output signal appears at the terminal 50.

Another saying of this is that, with the embodiment of FIG. 1, the excitation-stage amplifier 42 acts as a current-variation detector that internally generates or produces a signal indicative of current variations (drain current variation components) which are in a specific relationship with the voltage waveform of input signal, which relationship may be univocally determined depending upon the actual voltage waveform of the input signal. The controller 46 controls the power supply voltage Vps to be supplied Go the final-stage amplifier 44 in response to the current-variation detection signal, thereby to improve the linearity of it.

A power amplifier device 40a shown in FIG. 2 is similar to that of FIG. 1 with an amplitude-detector circuit 52 being additionally arranged between the output of the excitation-stage amplifier 42 and the input of the power-supply voltage controller 46. Detector 52 detects the amplitude of an envelope of an input signal being presently supplied at the input terminal 48 to generate a detection signal Sdtc, which is fed to controller 46. This controller performs a similar power-supply voltage control operation in response to signal Sdtc.

A power amplifier device 40b shown in FIG. 3 is similar to that of FIG. 2 with the final-stage amplifier 44 being slightly modified to have its input connected to the output of the exciter amplifier 42, rather than to the signal input terminal 48, thereby to provide a series circuit of excitation/final-stage amplifiers 42, 44. More specifically, power amplifier 40b has two-stage configuration, wherein the primary-stage amplifier 42 may function as an excitation stage for the final-stage amplifier 44. Also with such an arrangement, it is possible to successfully linearize final-stage amplifier 44.

In any one of the embodiments 40, 40a, 40b, when the final-stage amplifier 44 employs an MOSFET as its amplifying device, the power supply voltage controller 46 constitutes what is called the "drain-control linearizer," which may alternatively be called the "drain-controlled linearizer" in some situations. The operation principle of such linearizer will be described below.

See FIG. 4, which is a graph showing the input versus output characteristic of the drain-control linearizer. In FIG. 4, the axis of abscissa indicates the amplitude of an input signal supplied to the terminal 48 as shown in FIGS. 1-3, whereas the axis of ordinate shows the power of an amplified output signal appearing at the output terminal 50. It is apparent from viewing the graph that, while maintaining the saturation characteristic or the high efficiency characteristic of final-stage amplifier 44, an excellent linearity can be attained, by controlling the power supply voltage vps (that is, the drain-source voltage Vds, which will be simply called the "drain voltage Vd" hereinafter) with respect to variations in the input signal amplitude such that voltage vps is at a specific cross point P1, P2 or P3 of a line 54 with one of the input/output characteristic curves.

Now, attention is directed to a graph of FIG. 5 that presents the experimental results made by the present inventors. This graph indicates the relation of the exciter amplifier drain current Id1 versus the final-amplifier drain voltage Vd2. In the current versus voltage characteristic diagram, a broken line 56 shows the target value of drain current Id1 (the drain-source current as has been described previously), whereas an upper and lower lines 58, 60 extending on the opposite sides of broken line 56 defines an allowable error range therebetween. In an actually designed power amplifier device, it will naturally happen that a finite control error takes place therein. By taking account of this, the allowable error range is provided. The range is determined under an assumption that a possible error of the output signal power of final-stage amplifier 44 is 0.2 dB: Such range may be modified as required when reduction to practice of the invention.

The significance of the power amplifier devices 40, 40a, 40b is that it is possible to solve the conflicting problems in the prior art, that is, the achievement of higher operation efficiency and the enhancement in the linearity. More specifically, with the power amplifier devices 40, 40a, 40b are specifically arranged to detect the envelope amplitude (waveform) of an input signal on the basis of variations in the power supply current Ipsl (that is, the drain current Id1) flowing in the excitation-stage amplifier 42 to control the power supply voltage Vps2 (the drain voltage Id2) to be supplied to the final-stage amplifier 44 in response to the detection results under the control of the controller 46. Any digital circuits are not required to detect the amplitude of input signal. The elimination of such digital circuits enables noises to be prevented almost perfectly from taking place within the devices, and also the circuit configuration to be minimized as a whole. As a consequence, a maximized linearization can be accomplished while causing the signal-to-noise ratio to increase and forcing the power consumption to decrease.

Another significance of the embodiments 40–40b is that the circuit design flexibility of the power amplifier devices can be improved dramatically. More specifically, unlike the prior art as described previously in the introductory part of the description, the embodiments do not require any memory devices such as a read-only memory (ROM) for storing therein several digital values representing the input signal amplitudes, from which one of the values indicative of the presently most suitable input signal amplitude is read out depending upon the I and Q components of the input signal. In other words, the linearizer of the invention provides a self-supporting or "self-reliant" circuitry that may independently operate relying upon its own abilities and resources without any external assistance of supplying extra control signals thereto. This ensures that no additional signal transmission lines are necessitated between power amplifier device 40, 40a, 40b and a known modulation circuit associated therewith. In the circuit design of digital hand-held radiophones, both the embodiment power amplifier device and the modulator circuit can be designed freely independently of each other. This can enhance the applicability of the invention. The radiowave detector or the directional coupler, which provides a serious bar to the down-sizing of radiophones, is no longer necessary, which will contribute to the achievement of successful down-sizing of hand-held radiophones.

A further significance of the embodiments is that the above advantages come with an unexpected or surprising effect of attaining an improved temperature compensation characteristic and without any extra penalties. This can be said as follows. The power supply voltage controller 46 of FIGS. 1–3 and the detector circuit 52 of FIG. 2 or 3 are inherently small in circuit scale. These circuits 46, 52 can be easily "packed" onto a small size printed circuit board together with the excitation/final-stage amplifiers 42, 44; more preferably, the circuits 46, 52 can be integrated on the same semiconductor chip substrate together with amplifiers 42, 44. With such an integrated circuitry, it becomes possible to cause the controller 46 and the detector circuit 52 to exhibit a temperature characteristic that is extremely similar to or same as that of amplifiers 42, 44. This makes it possible that a control signal supplied by controller 46 to final-stage amplifier 44 is temperature-compensated successfully. When circuits 46, 52 are integrated together with excitation-stage amplifier 42 and final-stage amplifier 44 on a semiconductor chip substrate to provide a solid-state circuit, active elements employed therein such as transistors decrease in the occurrence of variations in the characteristic thereof; accordingly, the achievement of temperature compensation function will be made easier.

A still further significance of the embodiments is that the stability of power amplification operation can be improved. More specifically, with these embodiments, the detection of the input signal amplitude is not carried out prior to transmission of the input signal thereto; the detection is performed by detecting actual variations in the power supply current Ipsl of the primary-stage amplifier 42. As a consequence, even when primary-stage amplifier 42 varies in the amplification characteristics such as the gain, bias current, etc., such variations will not affect in any way the power supply voltage control of the final-stage amplifier 44. In the prior art as previously described in the introductory part of the description, if variations occur in the characteristics of primary-stage amplifier, the resultant input-signal amplitude detection can extremely decrease in accuracy. Furthermore, the prior art follows in principle the open-loop control technique: If the characteristic of the individual amplification element varies in the primary-stage amplifier, it becomes very difficult to suitably compensate for such variations. The embodiments can overcome the problem to provide an improved stability and reliability.

The power amplifier device 40b of FIG. 3 will be shown in further detail in FIG. 6. Power amplifier 40b includes a MOSFET Q1, which corresponds in function to the primary-stage amplifier 42 of FIG. 3. MOSFET Q1 may exhibit an AB-class amplification operation. MOSFET Q1 provides an excitation stage. MOSFET Q1 has an insulated gate coupled to the input signal terminal 48, a source connected to the ground potential, and a drain connected to an input of a resonator circuit 62. Resonator 62 has an output interconnected through a capacitor C1 to the gate of a second MOSFET Q2, which corresponds to the final-stage amplifier 44 of FIG. 3. MOSFET Q2 may be a transistor that may perform an F-class amplification operation.

The final-stage MOSFET Q2 has a drain connected to an input of a high-frequency (HF) signal processor circuit 64, and a source coupled to the ground potential. The HF processor 64 has an output interconnected to the signal output terminal 50 of FIG. 3 by way of a capacitor C2. HF processor 64 is an electrical switch circuitry that will become electrically "open" (nonconductive) with respect to odd-ordered harmonic waves, and alternatively becomes "close" (short-circuited) for even-ordered harmonic waves, causing MOSFET Q2 (final-stage amplifier 44) to operate in the F-class amplification mode.

As shown in FIG. 6, the resonator 62 is connected to a power supply unit (not shown) by way of a resistor R1, which has opposite nodes connected to a first input and a second input of an analog function generator circuit 66 through AC-coupling capacitors C3, C4, respectively. Resistor R1 is for detecting a current flowing in the drain of the excitation-stage MOSFET Q1; in this respect, resistor R1 may be called the "drain-current detecting" resistor. MOSFET Q1 is supplied with a drain voltage Vd1 the drain-current detecting resistor R1 and resonator 62; in that case, resistor R1 functions to detect a drain current Id1 that flows presently in MOSFET Q1 to generate a certain voltage that is proportional in potential to the detected drain current Id1. The detection voltage is fed to the inputs of function generator 66, which has an output interconnected to a drain voltage controller circuit 68. Components R1, C3–C4 and 66 may constitute the detector 52 of FIG. 3. Controller 68 supplies the MOSFET Q2 at its drain with a drain voltage that is potentially controlled in response to the output of function generator 66 by way of the HF processor 64. Controller 68 corresponds in function to the power-supply voltage controller 46 of FIG. 3.

The capacitors C3, C4 are provided to lighten the direct current (DC) off-set at the excitation-stage MOSFET Q1 by causing the analog function generator 66 to be alternate current (AC)-coupled to the drain current detection resistor R1. Such arrangement of capacitors C3, C4 may also be significant in that the occurrence of bad influence of variations in the bias point of MOSFET Q1 due to temperature variations can be weaken to attain an improved detection of drain current Id1 of MOSFET Q1 at higher accuracy, whereby the operation of the drain-control linearizer can become more stable. Note that, if required, capacitors C3, C4 may be removed causing analog function generator 66 to be directly connected to drain current detection resistor R1.

Attention should be paid to the fact that there is an important condition in the case of designing the power amplifier device of the invention: The drain current Id1 of the excitation-stage MOSFET Q1 (the power supply current of it) and the drain voltage Vd2 of the final-stage MOSFET Q2 (the power supply voltage thereof) are specifically arranged so that the latter is directly and univocally determinable by the former to provide a one-to-one correspondence relationship therebetween. This relationship between drain current Id1 and drain voltage Vd2 may vary depending upon the gate bias (input bias) condition of MOSFETs Q1, Q2. This will be explained below in further detail with reference to the experimental results made by the inventors.

Figure 7:
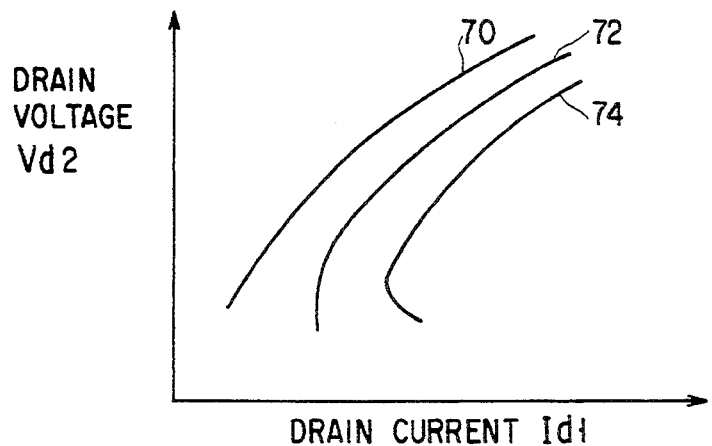

FIG. 7 indicates the relationship between the drain current Id1 of the excitation-stage MOSFET Q1 and the drain voltage Vd2 of the final-stage MOSFET Q2 with the gate bias of MOSFETs Q1, Q2 being as a parameter in the case where the analog function generator 66 is so designed as to provide the linearity of the power amplifier device. A curve 70 shows the one-to-one correspondence relation of drain current Id1 versus drain voltage Vd2; such relation may be easily represented by the use of the analog function generator 66. In other words, the achievement of function generator 66 becomes easier. On the other hand, with curves 72, 74, the Id1-to-Vd2 relation does no longer exhibit the one-to-one correspondence. It is necessary that two different kinds of values for drain voltage Vd2 are generated with respect to the same drain current Id1 in a region that Id1 is relatively small. This necessitates drain voltage Vd2 to be determined on the basis of the history of record regarding the Id1-to-Vd2 relation. As a result, the accomplishment of suitably designed function generator 66 is difficult, and the control is complicated undesirably.

The present inventors experimentally determined a suitable gate bias of each MOSFET Q1, Q2 which is reduced or converted into a saturation drain current Idss that flows when a sufficient drain voltage is applied to the MOSFET having gate and source being coupled together. The experimental results demonstrate the fact that, by determining the gate bias values so that the gate bias of MOSFET Q1 falls within a range less than $\frac{1}{8}$Idss(Q1) while that of MOSFET Q2 ranges less than $\frac{1}{4}$.Idss, the drain current Id1 and drain voltage Vd2 can be in the one-to-one correspondence relation as shown by line 70 in FIG. 7. Note here that such gate-bias condition will change depending upon the high-frequency terminal condition of MOSFETs Q1, Q2; accordingly, it is still a basic approach that circuit design conditions are suitably selected so as to cause current Id1 and voltage Vd2 to exhibit the one-to-one correspondence relation.

Figure 8:
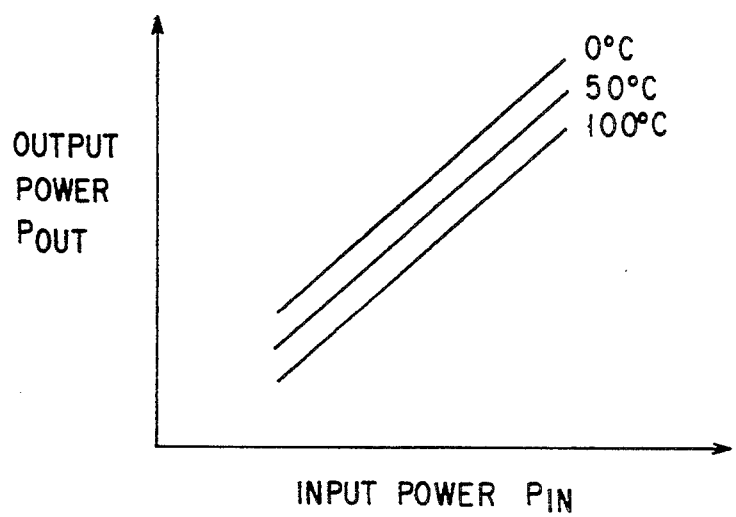

With the embodiment 40b of FIG. 6, similar advantages can also be accomplished. In addition, it becomes possible to provide stably self-compensated operations even if the power amplifier device 40b varies in characteristic (such as gain) due to variations in temperature. Such additional advantage will be described in detail with the support of experimentally measured data as follows. Remember that heat generates inside power amplifier devices, and that the device-inside temperature changes as several conditions vary such as the ambient temperature and operation time length. FIG. 8 shows the input-to-output characteristic (that is, the input power Pin versus output power Pout relation) of a power amplifier device having the two-stage circuit configuration as shown in FIG. 6 with temperature being as a parameter, wherein three cases are presented at three temperature points: 0° C., 50° C. and 100° C. As is apparent from viewing the graph of FIG. 8, assuming that the input power Pin is constant, the output power Pout decreases as the temperature increases. This suggests that it is necessary to either increase input power Pin or raise the drain voltage Vd2 of the final-stage MOSFET Q2 in potential in order to maintain the same output power level even when the temperature increases.

Now, the drain current Id1 of the excitation-stage MOSFET Q1 when the temperature changes is shown in FIGS. 9A and 9B. FIG. 9A shows a temperature (Tcj) versus drain current (Id1) relation in a case where the input power Pin remains small and MOSFET Q1 operates almost under the idle condition; FIG. 9B shows a temperature versus drain current relation in a case where input power Pin is in the maximum level. In each case, the drain current Id1 tends to increase as the temperature Tcj increases. It is apparent from viewing FIG. 9A that, when input power Pin is small and MOSFET Q1 is idle, current Id1 increases by approximately 10% when the temperature increases by 50 degrees. In contrast, as is apparent from FIG. 9B, when input power Pin is in the maximum level, current Id1 increases by approximately 5% when the temperature similarly increases by 50 degrees. This may be summarized as follows: Drain current Id1 of the exciter MOSFET Q1 increases by 5% to 10% as the temperature increases. Therefore, when the temperature increases beyond a predetermined level (let's assume it to be the "reference temperature"), an increase in drain current Id1 results in that the analog function generator 66 is supplied with an increased voltage that is greater in potential than a voltage corresponding to a drain current at the reference temperature; therefore, analog function generator 66 controls the drain voltage controller 68 of FIG. 6 such that the drain voltage Vd2 of the final-stage MOSFET Q2 becomes greater in potential than the drain voltage at the reference temperature. This means that a temperature increase causes output power Pout to increase, thus making it possible to compensate for the occurrence of variations in the input-to-output characteristic due to temperature variations.

One desirable designing procedure for the analog function generator 66 is as follows. To attain the above-mentioned temperature compensation in the power amplifier device, analog function generator 66 is first designed so that it is at the upper limit of a temperature compensation range, and then is designed such that it is at lower temperature points sequentially. The design procedure may alternatively be modified in such a manner that analog function generator 66 is first designed so as to be at the lower limit of the temperature compensation range, and then is designed such that it is at upper temperature points sequentially.

FIG. 10 shows a desired relationship between the drain current Id1 of the exciter MOSFET Q1 and the drain voltage Vd2 of the final-stage MOSFET Q2 when the analog function generator 66 is designed at different temperature points, that is, 0° C., 50° C. and 100° C. The characteristic designed at a low temperature (such as 0° C., for example) may expand a definable region of the drain voltage vs2 with respect to the drain current Id1; this makes it possible to remove away an undefined region as indicated by two dotted lines in FIG. 10, which will take place when a design is made at a high temperature (such as 100° C., for example). In other words, any undefinable region of current Id1 for voltage Vd2 can be forced to disappear. This enables analog function generator 66 to prevent any discontinuity from taking place in the output voltage of it.

A power amplifier device 40c having the main part as shown in FIG. 11 is similar to that of FIG. 6 with the analog function generator 66 being replaced with an analog function generator 66a and with several circuit components being added as will be described below. Function generator 66a includes an operational amplifier 80 and zenner diodes 82. Zenner diodes 82 are connected between an inverting input and an output of operational amplifier 80 together with several resistors as shown in FIG. 11. Operational amplifier 80 has a non-inverting input connected to an output of another operational amplifier 84, which has an inverting input connected through a resistor to the drain of the exciter MOSFET Q1, a non-inverting input connected to a voltage-dividing resistor circuit 86 being connected between the drain voltage Vd and the ground potential.

As shown in FIG. 11, an operational amplifier 88 and a MOSFET Q3 are arranged between the function generator 66a and the final-stage MOSFET Q2. MOSFET Q3 is a driver for MOSFET Q2. Operational amplifier 88 has an inverting input coupled to a bias voltage Vb, a non-inverting input connected to the output of operational amplifier 80 and to the ground potential through a resistor, and an output connected to the gate of driver MOSFET Q3. MOSFET Q3 is connected at its source to the output signal terminal 50, which is also connected to the drain of the final-stage MOSFET Q2 having the gate connected to the resonator 62 by way of capacitor C1.

With the power amplifier device 40c, the operational amplifier 84 functions as a prestage amplifier for the analog function generator 66a, which amplifier 84 amplifies a signal that varies in potential in accordance with the drain current of the exciter MOSFET Q1, causing the amplified signal to be fed to function generator 66a. Function generator 66a includes the operational amplifier 80 and zenner diodes 82 to provide a "folded line" analog function generating function. The characteristic diagram of such folded-line analog function is shown in FIG. 12, wherein a folded line (solid line) extends along a center line 90, which is laid within an allowable error range or window as defined between upper and lower dotted curves 92, 94 in the current versus voltage characteristic between the drain current Id1 of the exciter MOSFET Q1 and the drain voltage Vd2 of the final-stage MOSFET Q2. Folded line L consists of the minimum number (three, for example) of line segments L1, L2, L3. These line segments L1–L3 approximate or emulate the center line 90 at a predetermined similarity. It is recommendable that such folded-line function characteristic is determined by taking account of (1) the DC characteristic of the driver MOSFET Q3 for the final-stage MOSFET Q2, and (2) the characteristic of the operational amplifier 88 acting as a DC amplifier to drive the driver MOSFET Q3.

Figure 13:
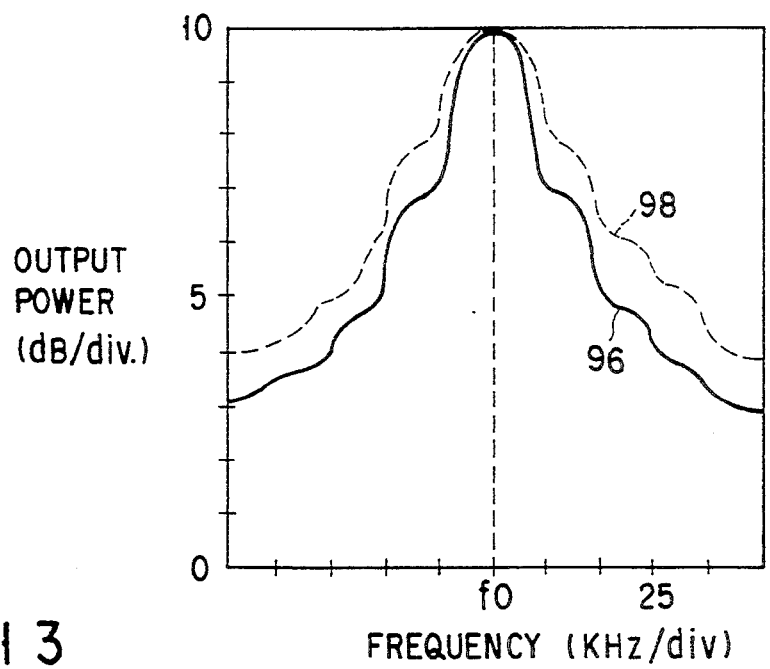
FIG. 13 is a frequency versus output-power characteristic diagram showing the experimental results of power amplifying performance of the embodiment.

FIG. 13 demonstrates the experimental measurement results of the frequency characteristic of an output waveform in the case where a high-frequency digital modulated input signal is amplified using the above embodiment device. This frequency characteristic was measured by the present inventors using a known spectrum analyzer equipment. The digital modulation signal was a quadrature phase shift keying (QPSK) modulation signal at the frequency of 800 MHz. A solid line 96 indicates the output power that was obtained by the embodiment power amplifier device employing the "drain-control" stabilization feature; a broken line 98 shows a corresponding waveform of the output power obtained by a power amplifier device that does not employ any drain-control linearization treatment. Comparing these characteristic curves 96, 98 with each other reveals the fact that the embodiment device could suppress successfully the occurrence of a leak power between neighboring channels in the frequency band that is far from the center frequency fo.

Figure 14:
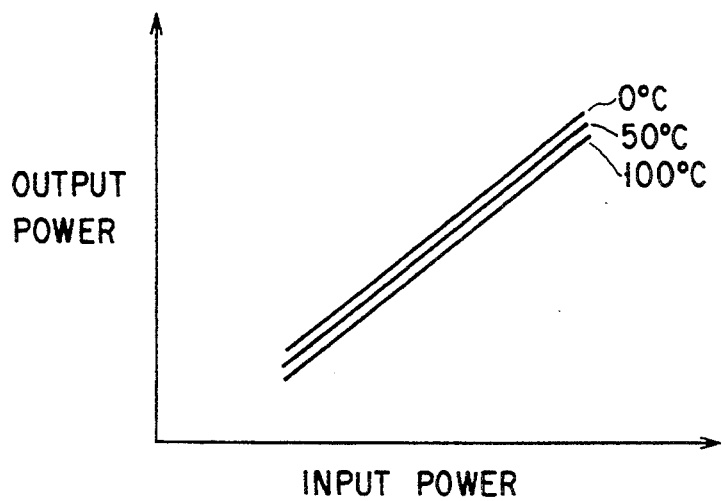
FIG. 14 shows the input power versus output power characteristic of the FIG. 11 embodiment as a parameter of temperature.
Figure 15:
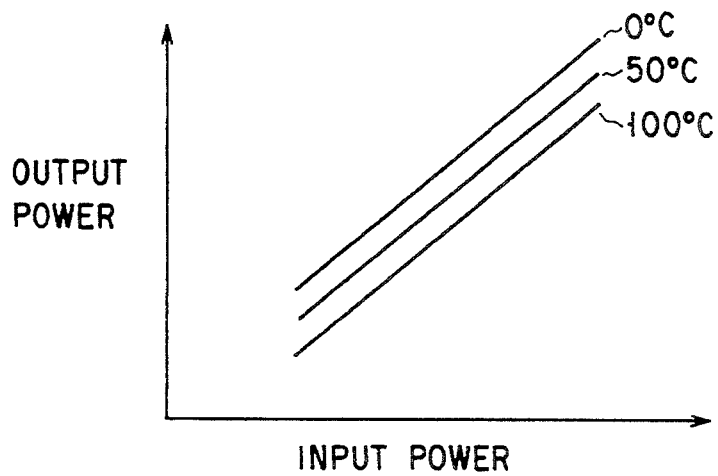
FIG. 15 shows a corresponding input/output characteristic of the prior art device.
Figure 16:
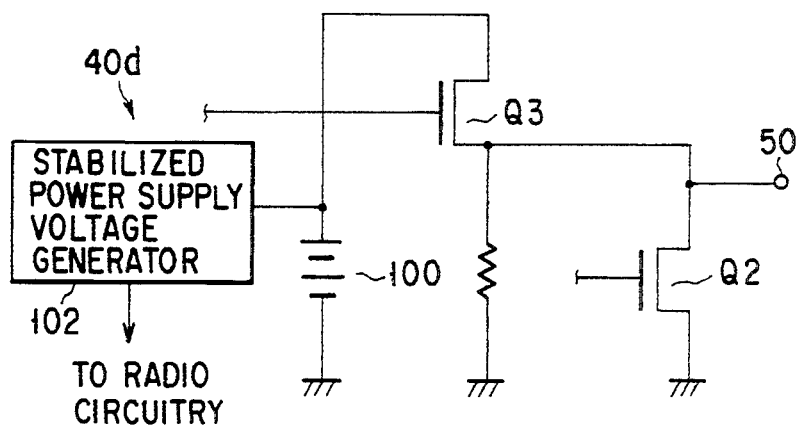

FIG. 14 shows the input/output characteristic of the power amplifier device 40c of FIG. 11 as a parameter of temperature in the case where a 800-MHz QPSK modulation signal is amplified, wherein the temperature is at 0° C., 50° C. and 100° C. A corresponding input/output characteristic of the prior art is shown in FIG. 15. As is apparent from viewing these diagrams, the embodiment can be suppressed in the occurrence of variations in the output power as the temperature varies in comparison with the prior art. This demonstrates that the embodiment device can also be improved in the temperature compensation performance.

The power amplifier device may be partially modified in configuration as shown in any one of FIGS. 16–20. First of all, with a modification 40d of FIG. 16, the driver MOSFET Q3 included in the drain voltage controller 68 of FIG. 6 is connected to the drain electrode of the final-stage MOSFET Q2 having the F-class amplification function. This driver MOSFET Q3 is coupled at source to the ground potential through a resistor, and is directly connected at its drain to a direct current (DC) power supply section 100, which electrically feeds MOSFET Q3. DC power supply 100 may be a known battery unit. A stabilized power supply generator circuit 102 is connected to DC battery unit 100. This power supply circuit 102 receives the DC power supply voltage as supplied by the battery 100 to generate a stabilized power supply voltage, which is supplied to a known radio circuitry section associated with the power amplifier device in a hand-held radiophone (not shown). With such an arrangement, by utilizing the control function of the power-supply voltage controller 46 of FIGS. 1–3 or the drain voltage controller 68 of FIG. 6 (or MOSFET Q3 of FIG. 11), it becomes possible to remove the necessity of providing a stabilized power supply circuitry on the drain side of the final-stage MOSFET Q2, which may consume much power. The circuit configuration can thus be simpler causing the down-sizing of device to be further enhanced, while having the power consumption decreased.

Figures 17, 18:
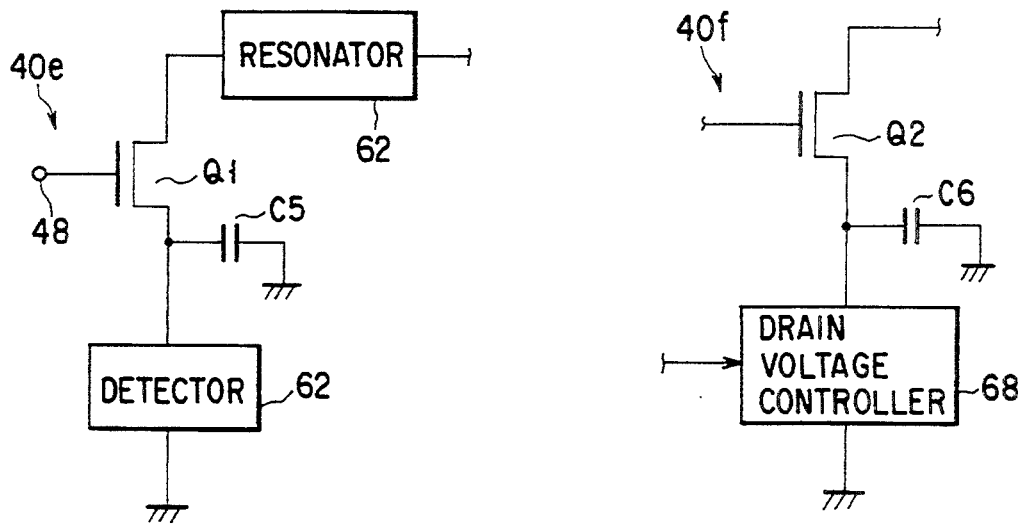

In a power amplifier device 40e shown in FIG. 17, the detection of the power supply current flowing in the exciter MOSFET Q1 is carried out by the detector circuit 52, which is connected to the source electrode of MOSFET Q1 together with a capacitor C5. With such an arrangement, the positional separation can be facilitated between detector 52 and resonator 62 when they are mounted in a hand-held radiophone.

In a power amplifier device 40f shown in FIG. 18, the drain voltage controller 68 is connected to the source electrode of the final-stage MOSFET Q2 together with a capacitor C6. With such an arrangement also, it is possible to perform the control of the drain voltage of MOSFET Q2 successfully.

Figure 19:
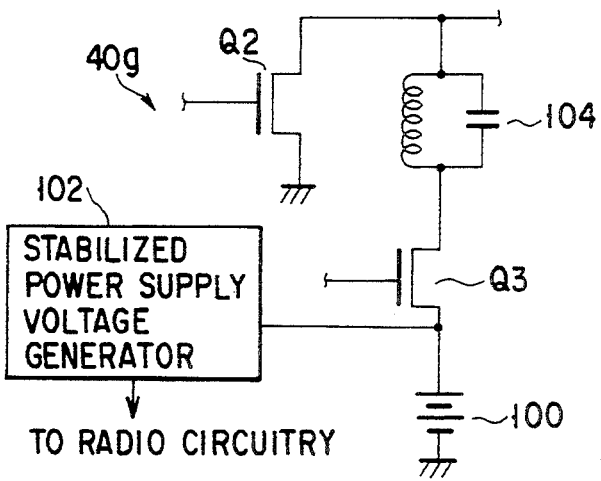

In a power amplifier device 40g shown in FIG. 19, the driver MOSFET Q3 is connected to the drain of the final-stage MOSFET Q2 by way of a resonance circuit 104, which may be a known parallel circuit of a capacitor and an inductive element. Driver MOSFET Q3 is directly connected at its source to the DC battery unit 100, to which the stabilized power supply voltage generator circuit 102. Driver MOSFET Q3 is directly supplied by battery 100 with a necessary DC power.

A power amplifier device 40h shown in FIG. 20 is similar to that of FIG. 17 with several circuit components being additionally provided as follows. A resistor R2 is connected to the source of the excitation-stage MOSFET Q1 as a drain current detection resistor. The voltage across resistor R2 is input to the drain voltage controller 68 through the analog function generator circuit 66. With such an arrangement, it is possible to cause drain-current detection resistor R2 to be arranged separately from the high-frequency resonator circuit 62 so that these circuit components R2, 62 are spaced part from each other in a hand-held radiophone to which the embodiment is applied. Also with this device, drain voltage controller 68 is connected to the drain of the final-stage MOSFET Q2 by way of the resonance circuit 104 as shown.

A power amplifier device 40i is shown in FIG. 21, wherein a MOSFET Q4 constituting a final-stage amplifier is arranged to have a gate connected to a high-frequency signal input terminal 110, a source coupled to the ground potential, and a drain interconnected to an output terminal 112 through a series circuit of a tuner circuit 114 and a capacitor C7. Tuner 114 is also connected to a resistor R3, which has opposite nodes connected to inverting and non-inverting inputs of an operational amplifier 116 by way of capacitors C8, C9 respectively. Resistor R3 functions as a drain current detection element. The output of a prestage amplifier 116 is connected to a non-inverting input of a differential amplifier 118. This amplifier has an inverting input coupled to a DC battery 120 that provides a reference voltage Vref, and an output connected to an output control circuit 122. This output controller 122 has a control terminal 124, to which a high-frequency input status signal Sst is supplied as a sampling pulse signal. Output controller 122 may include a known sample-and-hold circuitry. While a high-frequency input signal may be supplied to terminal 110 from an excitation-stage MOSFET (not shown), which is similar to the MOSFET Q1 as described previously, signal Sst is generated to indicate whether a high-frequency input is actually made to final-stage MOSFET Q4. The output of output controller 122 is fed back to the gate of MOSFET Q4 through an inductive element 126 for eliminating or preventing high-frequency components to pass through it.

When a high-frequency input signal is fed to the terminal 110, the input signal is supplied to the gate of the final-stage MOSFET Q4. MOSFET Q4 is also supplied at its drain with a drain current from a known drain current source through the tuner 114 and drain-current detection resistor R3. A resulting voltage across resistor R3 is applied through capacitors C8, C9 to the prestage amplifier 116, which then amplifies the voltage up to a predetermined potential level. The amplified output voltage of operational amplifier 116 is then supplied to the non-inverting input of the differential amplifier 118, which is presently supplied at its inverting input with a reference voltage that corresponds in potential to a desired drain current. Thus, a specific "difference" voltage indicative of the potential difference between the two input voltages appears at the output of the differential amplifier 118. Such output voltage is then supplied to the output controller 122, which is supplied the high-frequency input status signal Sst as has been described above.

The output controller (sample-and-hold circuit) 122 is set in a sampling mode when the high-frequency input status signal Sst is at a first potential level indicative of the "presence of a high-frequency input," thereby to sample the output voltage of the differential amplifier 118. When the status signal Sst is at a second potential level indicative of the "absence of high-frequency input," output controller 122 is set in the hold state; during the hold period, output controller 122 maintains a sampled potential. The output of this controller 122 is fed back to the gate of the final-stage MOSFET Q4 through the high-frequency cut-off inductor 126, thereby to control a gate bias (that is, the gate-to-source voltage Vgs) of MOSFET Q4.

With the power amplifier device 40i, the drain current of the final-stage MOSFET Q4 is controlled to be at a desired value as determined depending upon the reference voltage vref. Therefore, by suitably selecting the reference voltage vref, it is possible to force the drain current of MOSFET Q4 to satisfy the condition that can attain a reduced distortion.

Figure 22:
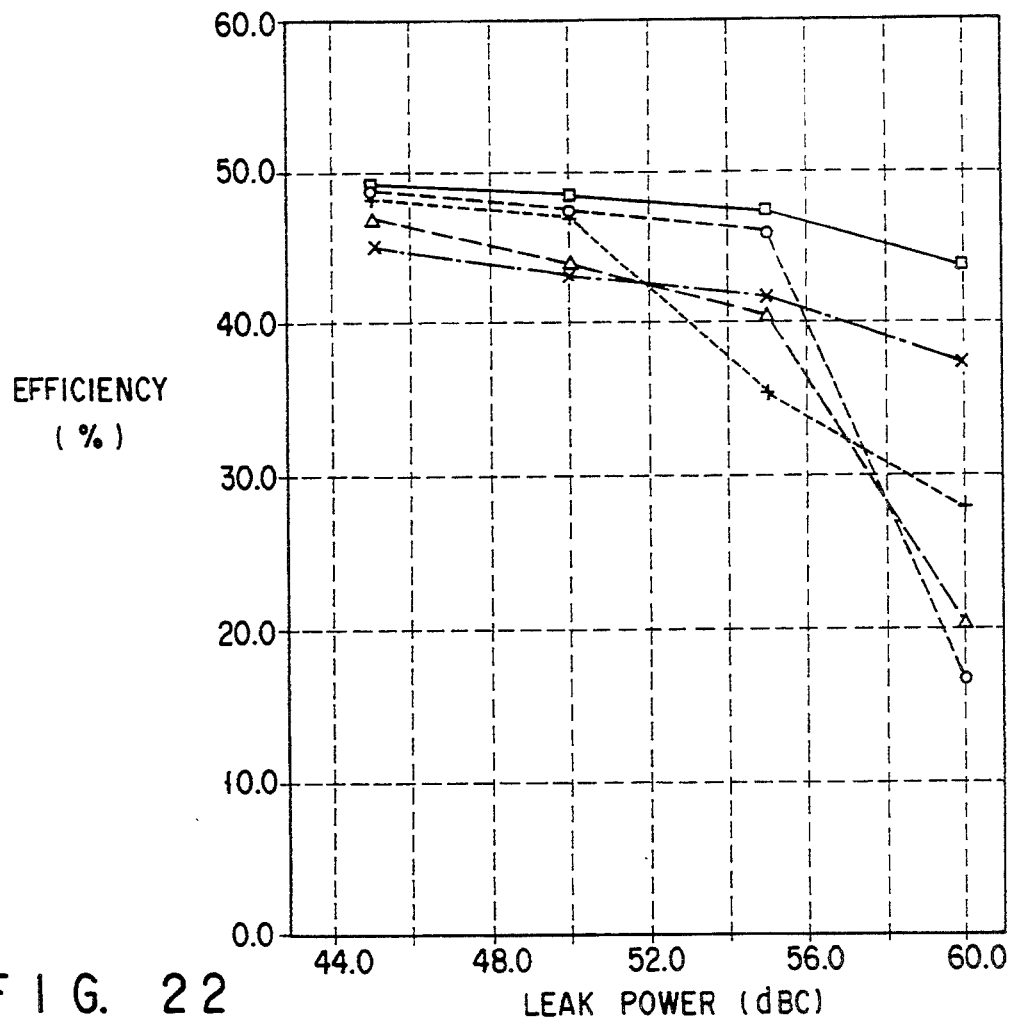
FIG. 22 shows the experimental results of a power added efficiency versus leak power characteristic in connection with the FIG. 21 embodiment.

The experimental results made by the present inventors are presented below to demonstrate advantages of the embodiment device. The inventors made experiments by making use of a power amplifier device employing the prior-art two-stage amplifier structure as described in the introductory part of the description. Firstly, we analyzed the best mode condition (particularly, the final-stage drain current) for rendering the linearity maximized. The experimental results indicate the fact that, when no signals are present, the drain current was around 150 milliamperes (mA) under the optimal operation condition. Ten samples were prepared to measure the linearity characteristics of them, while the drain current is set at 150 mA with the signal-absent final-stage gate bias being adjusted differently, to check whether the samples improve in linearity. Five representative ones among these samples were subjected to the measurement of power-added efficiency while they satisfy the adjacent-channel leak power, the results of which are shown in a graph of FIG. 22. This graph indicates that the power-added efficiency of more than 42% was achieved at a leak power of $-50$ dB to ensure that the transmission power was 1 watt or more. This reveals the fact that such results are equivalent to the efficiency as attained under the optimal operation condition.

Figure 23:
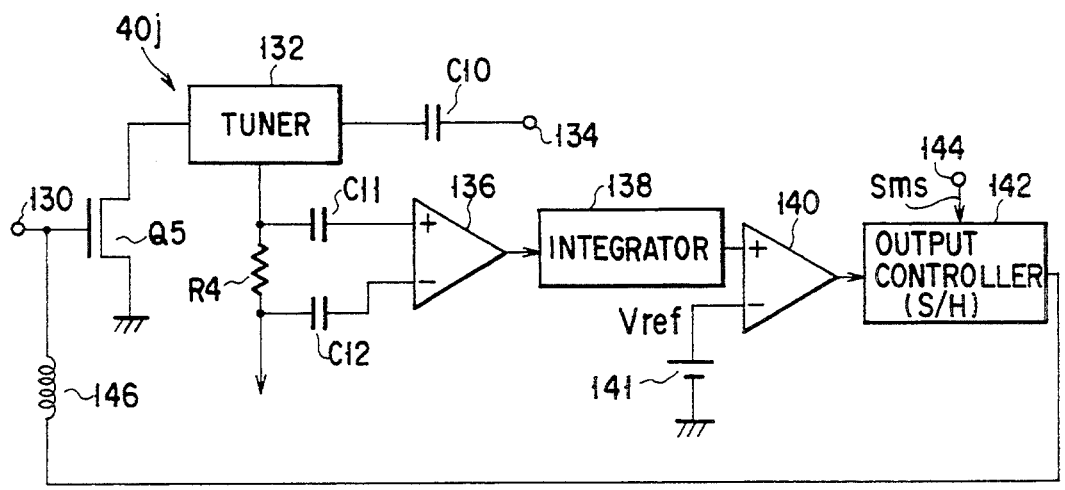
FIG. 23 shows a power amplifier device also embodying the invention.

A power amplifier device 40j in accordance with a further embodiment of the invention is shown in FIG. 23. A MOSFET Q5 is provided as the primary-stage power amplifier. MOSFET Q5 has a gate electrode connected to an input terminal 130, a source electrode coupled to the ground potential, and a drain electrode connected to a tuner circuit 132. A high-frequency modulation signal is supplied to terminal 130. The output of tuner 132 is connected through a coupling capacitor C10 to an output terminal 134.

The primary-stage MOSFET Q5 is also supplied at its drain with a power supply voltage (drain voltage), which may be supplied by a known drain power supply section (not shown) by way of a drain-current detection resistor R4. The voltage across resistor R4 is applied through capacitors C11, C12 to a prestage amplifier 136 including a known operational amplifier, which amplifies the voltage up to a suitable level. The amplified output of prestage amplifier 136 is then input to an integrator circuit 138, which has a time constant that is selected to be greater than the period of the high-frequency modulation input signal. Thus, a signal corresponding to the average value of the drain current of primary-stage MOSFET Q5 at the time of modulation is generated at the output of integrator 138.

The output signal of the integrator 138 is supplied to a non-inverting input of the differential amplifier 140. This differential amplifier 140 has an inverting input connected to a DC battery, which provides a reference voltage Vref indicative of a desired value of drain current of the primary-stage MOSFET Q5. Reference voltage Vref is supplied to the inverting input of differential amplifier 140. A difference voltage appears at the output of differential amplifier 140, which voltage indicates the potential difference between the output voltage of prestage amplifier 136 and the reference voltage Vref.

The output voltage of the differential amplifier 140 is fed to an output control circuit 142, which includes a sample-and-hold circuitry. Output control circuit 142 has a control terminal 144, to which a modulation status signal Sms is supplied as a sampling pulse signal. Signal Sms indicates in potential the presence or absence of a high-frequency modulation input signal at the gate of the primary-stage MOSFET Q5, that is at the input terminal 130.

The output controller 142 is set in the sampling mode when the modulation status signal Sms indicates the "presence of modulation"; at this time, controller 142 samples the output voltage of the differential amplifier 140. When signal Sms indicates the "absence of modulation," controller 142 is set in the hold mode to hold the sampled voltage during an absence-of-modulation period. The output voltage of controller 142 is then fed back to the gate of the primary-stage MOSFET Q5 as a control signal by way of a high-frequency cutoff inductor 146, thereby to control the gate bias of MOSFET Q5 (that is, the gate-to-source voltage Vgs).

Figures 24A, 24B:
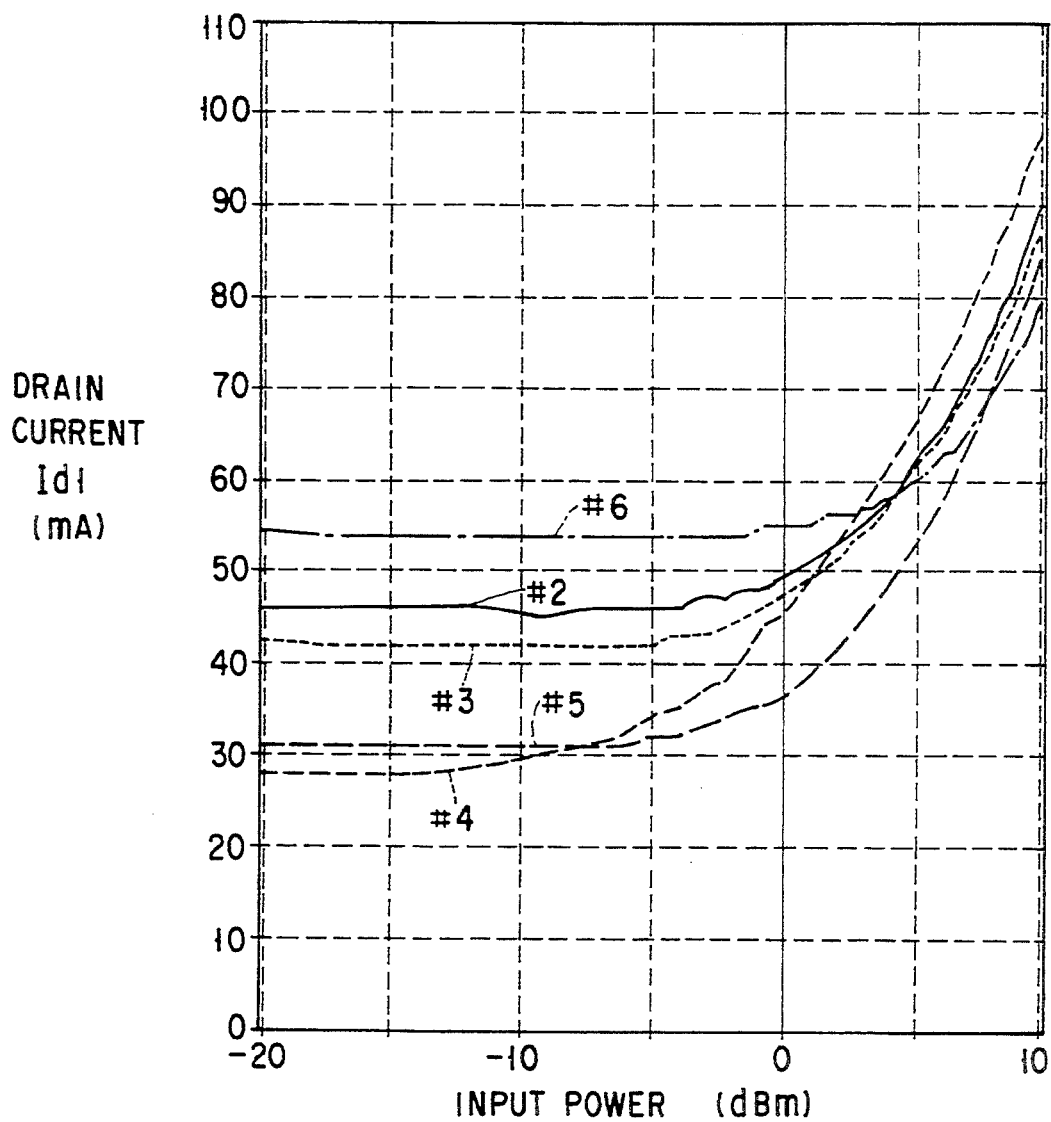

The principle of the operation of the embodiment device 40j of FIG. 23 will be described with reference to the experimental results as shown in FIGS. 24A–25B. The inventors analyzed the drain current of the primary-stage MOSFET Q5 in the power amplifier device having the two-stage amplifier structure. Ten samples were prepared; with respect to every sample, the gate bias of the primary-stage MOSFET and that of the final-stage MOSFET are adjusted and fixed in value so as to provide a maximized linearity. Under such condition, the drain current Id1 of the primary-stage MOSFET in the individual sample was measured while having the high-frequency input power variable. The experimental results are shown in FIG. 24A, which indicates the input power versus the primary-stage drain current (Id1) relation with respect to five representative samples #2–#6 of the ten samples. FIG. 24B shows the output voltage of the integrator 138 of FIG. 23 (that is, the integration values of drain current Id1) in regard to the representative samples. It is apparent from viewing FIG. 24A that, in the case of minimal input, the drain current Id1 varies within a range defined between 28 mA and 55 mA. On the other hand, for certain samples that remain smaller in drain current Id1 at the time of minimal input, an increase in drain current Id1 remains small when the input power increases.

Figures 25A, 25B:
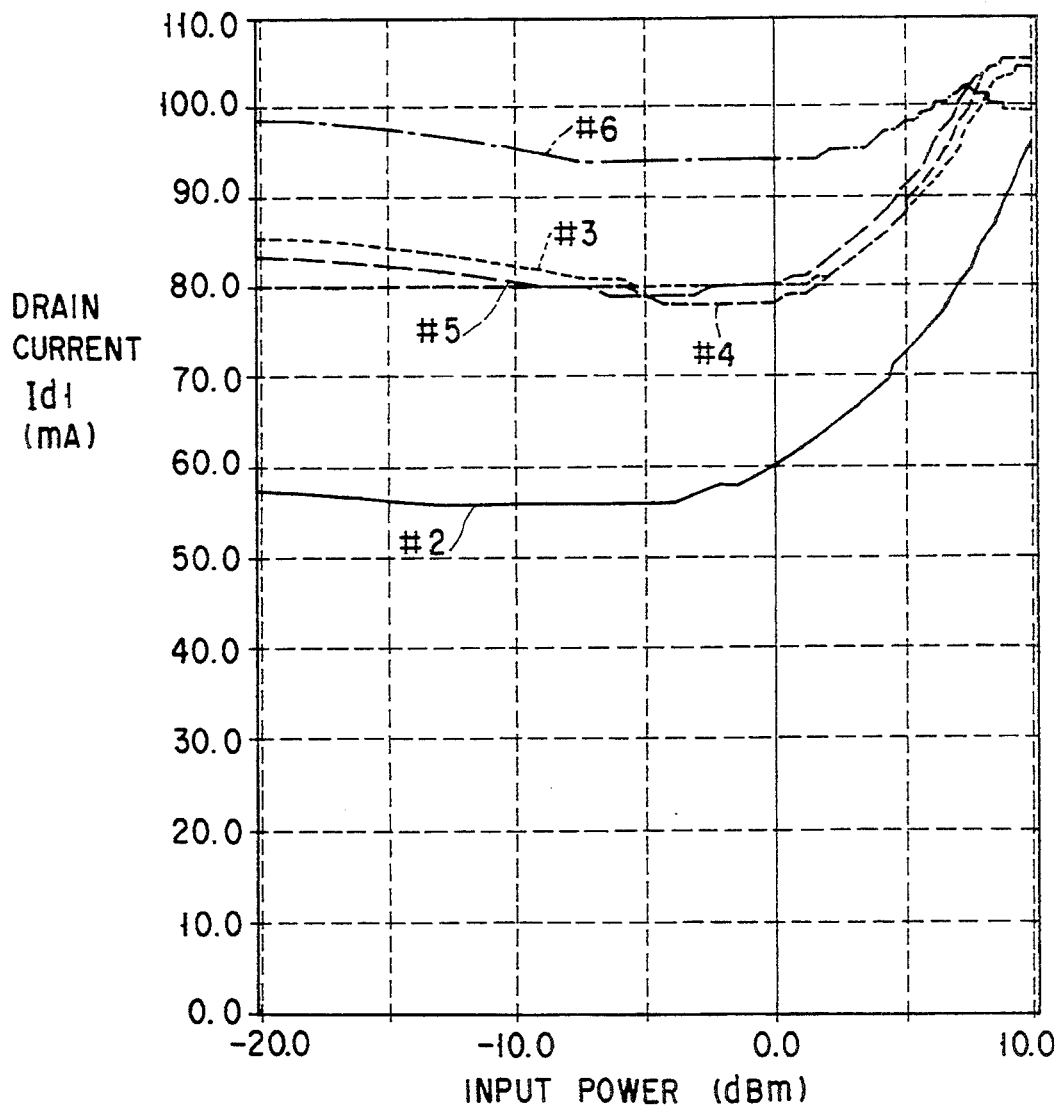

FIG. 25A shows the experimental results regarding the input power versus drain current (Id1) relation when the primary-stage gate bias changes by 1 volt. While the sample characteristics indicated in FIG. 25A are similar in general to those of FIG. 24A, the former is different greatly from the latter in the integration values of drain current Id1. From the above discussions, the results may be summarized as follows: It can be considered that the integration values of drain current Id1 tend to be concentrated around a certain point.

Accordingly, if the gate bias of the primary-stage MOSFET Q5 is suitably controlled under the assistance of the differential amplifier 140 and the output controller 142 so that the output voltage, which is obtained by causing the integrator 138 of FIG. 23 to integrate a voltage signal corresponding to the drain current of MOSFET Q5, is equivalent to the reference voltage Vref of FIG. 23, it becomes possible to enhance the linearity while the reference voltage vref is suitably selected in potential.

Note here that, in the two-stage power amplifier device, it may be also effective for the linearity enhancement to combine (1) the circuit configuration for adjusting the drain current of the final-stage MOSFET at a desired value (150 mA, for example) by controlling the final-stage gate bias in the absence of any high-frequency input signal as in the embodiment 40i of FIG. 21, with (2) the circuit configuration using the "drain-control" linearizer as described previously.

FIG. 26 presents the experimental results showing the relationship between the drain current Id1 of the primary-stage MOSFET and the drain voltage Vd2 of the final-stage MOSFET in the power amplifier device. In FIG. 26, a dotted line indicates the control target value of drain voltage, whereas a solid line and a broken line define therebetween the allowable error range for the drain voltage control. Such allowance range is provided by taking account of the fact that control errors may occur in an actually reduced power amplifier device. The range indicated in FIG. 26 was determined under the condition that an error of the output signal power of the final-stage MOSFET is 0.2 dB, although such range may be modified as needed.

As is apparent from viewing FIG. 26, the desired value of the drain voltage Vd2 of the output-stage MOSFET varies in proportion to the amplitude of a high-frequency input signal, that is, the drain current Id1 of the primary-stage MOSFET. Additionally, the previous characteristic diagram of FIG. 12 indicates the relation of the drain current Id1 versus drain voltage Vd2 in the absence of any high-frequency input signal in the case where the gate bias of the final-stage MOSFET is not adjusted: The analog function generator 66, 66a is required due to the fact that current Id1 and voltage Vd2 do not change linearly with respect to each other. In contrast, with the embodiment 40j, such analog function generator is not required. This means that the linearity can be improved, without the use of any extra function generator circuitry, by providing the final-stage MOSFET with the drain voltage Vd2 that is proportional to the amplitude of a high-frequency input signal.

A power amplifier device 40k shown in FIG. 27 includes the combination of the embodiments of FIGS. 21 and 23. More specifically, the drain-control linearizer circuit of FIG. 21 is connected in tandem to that of FIG. 23 in such a manner that the drain of excitation-stage amplifier MOSFET Q5 is connected to the gate of final-stage amplifier MOSFET Q4 by way of the tuner 132 and capacitor C10. A MOSFET Q6 is arranged which has a drain connected to the drain-current detection resister R3, and a gate interconnected to a drain voltage control circuit 150. The drain voltage controller 150 is connected to the input of integrator 138 and to the output of prestage amplifier 136, whereby the output signal of prestage amplifier 136 is supplied to the drain voltage controller 150. Controller 150 controls the resistance value of MOSFET Q6 in response to the output signal, so that the drain voltage Vd2 of the final-stage MOSFET Q4 can be adjusted suitably. This enables drain voltage Vd2 of final-stage MOSFET Q4 to be controlled to vary in proportion to the drain current Id1 of exciter MOSFET Q5 (that is, the amplitude of the high-frequency input signal).

FIG. 28 is a graph presenting the experimental measurements concerning the relation of the primary-stage MOSFET drain current Id1 versus the final-stage MOSFET drain voltage Vd2 among a plurality of samples in the same manner as in the case of FIG. 26, wherein for each sample B, C, a dotted line shows the control target value, whereas: a solid line and a broken line define therebetween an allowable error range. In each sample B, C, while the drain-voltage control target value and the drain current Id1 exhibit the linear relation in general, differences take place in the slope (the proportional constant) and in the off-set voltage thereof. Such differences may be compensated for by adjusting the characteristic using the drain voltage controller 150. With the embodiment, any deviations in the characteristic of the individual MOSFET operating in the saturation region can be absorbed as a result of the proportional constant and the off-set value being variable when the drain voltage that is proportional to the high-frequency input-signal amplitude is applied to the final-stage MOSFET as in the embodiment of FIG. 23.

Another power amplifier device 40m is shown in FIG. 29. The device 40m includes a MOSFET Q6 having a gate electrode connected to an input terminal 160, a source electrode coupled to the ground potential, and a drain electrode connected being applied with a drain voltage by way of a tuner circuit 162 and a drain-current detection resistor R5 from a known power supply section (not shown). When a high-frequency modulation signal is supplied to terminal 160, such signal is input to the gate of MOSFET Q6. A resultant voltage across resistor R5 is given to a prestage amplifier 164 through capacitors C13, C14. The output of prestage amplifier 164 is supplied through a smoothing circuit 166 to a non-inverting input of a differential amplifier circuit 168 constituting a voltage comparator 168. Comparator 168 has an inverting input connected to a DC battery unit 170 providing a reference voltage 170 of a preselected level. Comparator 168 compares the input voltage with reference voltage vref to produce an output signal at a terminal 169, thereby to determine whether or not the modulation of a high-frequency modulation signal at the gate of MOSFET Q6 is present. With the embodiment, a modulation status signal that corresponds to the signal Sms of FIG. 23 can be obtained at the output of voltage comparator 168. This makes it unnecessary to externally supply such modulation status signal Sms, which can reduce in number the external signal transmission lines and connection terminals therefor.

A power amplifier device 40n is shown in FIG. 30. The device 40n is similar to that of FIG. 27 with an extra function being added as follows: The biasing operation is performed with respect to the gate of the individual MOSFET Q4, Q5 with the biasing timing being different from each other in the two-stage power amplifier device 40k of FIG. 27 including the primary-stage MOSFET Q5 and the final-stage MOSFET Q4 to provide an intermittent operation, thereby to facilitate the device to begins to activate at an increased safety. For the convenience of explanation, four switches 172, 174,176,178 are employed for such bias-timing control, as will be described below.

Figure 31:
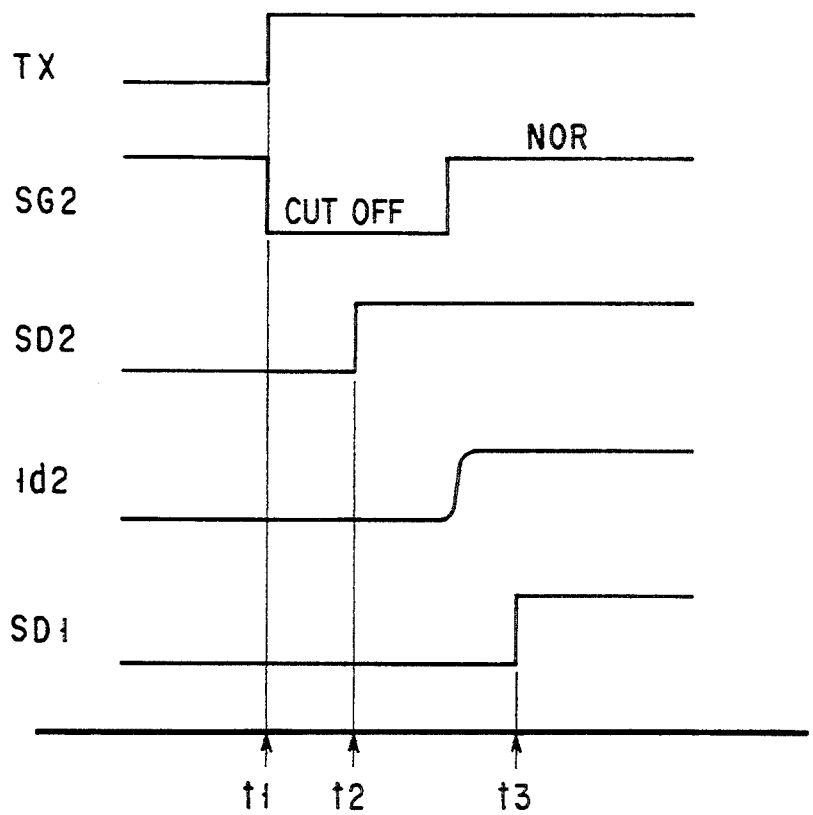
FIG. 31 is an illustration of timing diagram showing the pulsing sequences of the embodiment of FIG. 30.

As shown in a timing diagram of FIG. 31, when the device begins to operate, the switch 176 turns on firstly, causing a gate bias for cutting off the drain current is supplied to the final-stage MOSFET Q4 at a time point t1. Then, another switch 178 turns on causing the drain voltage Vd2 to be applied to MOSFET Q4 at a time t2. The gate bias is changed by the switch 176, causing the drain current to increase up to a desired level. Thereafter, the switch 174 turns on causing the drain voltage to be applied to the primary-stage MOSFET Q5 at a time t3.

With such an arrangement, under a specific condition that the primary-stage MOSFET Q5 is not operative so that the final-stage MOSFET Q4 is not excited by a high-frequency input, it becomes possible to adjust the drain current of the final-stage MOSFET Q4 at a desired value. Furthermore, the application of the drain voltage is performed in the cut-off state that the final-stage MOSFET Q4 is not supplied with the gate bias, so that the activation safety can be improved.

Moreover, in the power amplifier device performing intermittent operations, the gate bias is supplied for causing the drain current of the final-stage MOSFET Q4 to cut off in the sequence as described above at the activation and following time points at a fixed interval. The gate bias is changed causing the drain current to increase up to a desired level; thereafter, the application of the drain voltage of the primary-stage MOSFET Q5 is carried out. With such an arrangement, the device can adapt any time changes.

Figure 32:
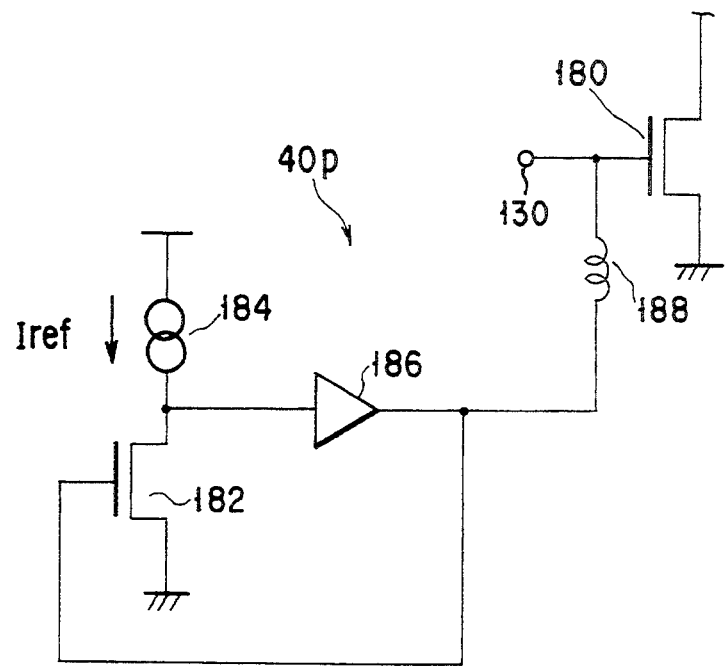

A power amplifier device 40p is shown in FIG. 32, wherein the main part of a bias-condition setting circuitry is indicated which is for suitably setting the bias condition of the power amplifier device so that the drain current of power amplifying MOSFET is at a desired value. A power-amplifying MOSFET 180 and a reference MOSFET 182 are provided in the device. The gate voltage of MOSFET 182 is controlled by causing a desired reference current Iref to flow into reference MOSFET 182 from a current source 184, and by causing the drain voltage of reference MOSFET 182 to be fed back to the gate of itself through a feed-back circuit 186. The gate voltage of reference MOSFET 182 is then applied through an inductor 188 to the gate of power-amplifying MOSFET 180, thereby to make it possible to control the drain current of MOSFET 180 at any desired value.

If the power-amplifying MOSFET 180 and the reference MOSFET 182 are arranged together on the same substrate, the temperature compensation performance can be improved. In particular, when MOSFETs 180, 182 are integrated together on a semiconductor chip substrate, the resulting temperature compensation performance will be further improved. Even when the both MOSFETs 180, 182 are adjusted to the scaling design, the above operations may be attained if such scaling is suitably compensated for.

The present invention is not limited to the above-described specific embodiments and may be practiced or embodied in still other ways without departing from the spirit or essential character thereof. For example, while the MOSFETs are employed in the embodiments as described previously, such MOSFETs may be replaced with bipolar transistors if required.

What is claimed is:

1. A power amplifier device comprising:
 an input terminal;
 a first amplifier connected to said input terminal so as to amplify an input signal of said input terminal;
 a second amplifier connected to said input terminal, for amplifying said input signal of said input terminal;
 control means, connected to said first and second amplifiers, for detecting variations in a power supply current fed to said first amplifier and for controlling a power supply voltage which is supplied to said second amplifier in accordance with a detected current variation;

an output terminal connected to said second amplifier so as to receive an output of said second amplifier;

detector means, connected to said first amplifier, for monitoring variations in said power supply current that appear while said first amplifier amplifies an input signal supplied thereto, and for generating a detection signal indicative of a current variation component that univocally corresponds to a waveform of said input signal, and for causing a power supply voltage of said second amplifier to vary potentially in response to said detection signal to thereby increase a linearity thereof.

2. The power amplifier device according to claim 1, wherein said first amplifier includes a first transistor having a first current-carrying electrode, a second current-carrying electrode, and a control electrode to which said input signal is supplied, and wherein said detector means includes:

a resistive element connected to one of said first and second current-carrying electrodes of said first transistor; and an analog function generator circuit connected to said resistive element.

3. The power amplifier device according to claim 2, wherein said second amplifier includes a second transistor having third and fourth current-carrying electrodes, and wherein said linearizer means includes:

potential controller means, connected to said analog function generator circuit and to one of said third and fourth current-carrying electrodes of said second transistor for causing a bias voltage applied to said one of said third and fourth current-carrying electrodes to vary in potential in response to an output of said analog function generator circuit.

4. The power amplifier device according to claim 1, wherein said detector means includes:

a resistor connected to said first amplifier;

an analog function generator circuit having first and second input terminals connected to said resistor, and an output terminal; and voltage control means, having an input terminal connected to said output terminal of said analog function generation circuit and an output terminal connected to said second amplifier, for controlling a bias voltage of said second amplifier.

5. The power amplifier device according to claim 4, wherein said first amplifier includes a first transistor, and said second amplifier includes a second transistor.

6. The power amplifier device according to claim 5, wherein said first transistor has a gate electrode to which said input signal is applied, and a drain electrode connected to said resistor, and wherein said second transistor has a drain electrode connected to said voltage control means.

7. The power amplifier device according to claim 6, wherein said second transistor has a gate electrode at which said input signal arrives.

8. A power amplifier device for amplifying a high-frequency input signal, comprising:

power amplifier circuit means having a transistor for receiving said high frequency input signal and for amplifying said high frequency input signal;

detector circuit means, connected to said power amplifier circuit means, for detecting variations in a power supply current flowing in said power amplifier circuit means and for generating a detection signal, said detector circuit means including resistive means, connected to a drain electrode of said transistor, for detecting a drain current flowing in said transistor and for generating a corresponding voltage at first and second nodes of said resistive means, a prestage amplifier having first and second input terminals connected to said first and second nodes of said resistive means, and an output terminal, and AC-coupling capacitor means, connected between said resistive means and said prestage amplifier, for causing said prestage amplifier to be AC-coupled to said resistive means;

potential-difference detection circuit means, having a first input terminal to which said detection signal is supplied and a second input terminal to which a reference voltage signal is supplied, for generating an output signal indicative of a potential difference between said detection signal and said reference voltage signal;

a sample-and-hold circuit having an input node coupled to said output signal of said potential-difference detection circuit means, and an output node, said sample-and-hold circuit being responsive to a control signal indicating a status of said high frequency input signal; and conductor means for electrically connecting said sample-and-hold circuit to said power amplifier circuit means, thus allowing said output node of said sample-and-hold circuit to be fed back to said power amplifier circuit means, and for causing an input bias voltage of said power amplifier circuit means to vary in response to an output signal of said sample-and-hold circuit to thereby linearize said power amplifier circuit means.

9. The power amplifier device according to claim 8, wherein when said high frequency input signal is present, said sample-and-hold circuit samples said output signal of said potential-difference detection circuit means, and wherein said sample-and-hold circuit holds said output signal when said high frequency input signal is absent.

10. The power amplifier device according to claim 9, wherein said transistor of said power amplifier circuit means has a gate electrode to which said high frequency input signal is applied.

11. The power amplifier device according to claim 10, wherein said output node of said sample-and-hold circuit is connected to said gate electrode of said transistor of said power amplifier circuit means.

12. A power amplifier device comprising:

an input terminal;

a first amplifier, connected to said input terminal, for amplifying an input signal of said input terminal;

a second amplifier, connected to said first amplifier, for amplifying an output of said first amplifier;

an output terminal, connected to said second amplifier, for receiving an output of said second amplifier;

detector means, connected to said first amplifier, for monitoring variations in a power supply current that appear while said first amplifier amplifies an input signal supplied thereto, and for generating a detection signal indicative of a current variation component that univocally corresponds to a waveform of said input signal; and linearizer means, connected to said detector means, for causing a power supply voltage of said second amplifier to vary potentially in response to said detection signal to thereby increase a linearity thereof.

13. The power amplifier device according to claim 12, wherein said first amplifier includes a first transistor having a first current-carrying electrode, a second current-carrying electrode, and a control electrode to which said input signal is supplied, and wherein said detector means includes:
   a resistive element connected to one of said first and second current-carrying electrodes of said first transistor; and
   an analog function generator circuit connected to said resistive element.

14. The power amplifier device according to claim 13, wherein said second amplifier includes a second transistor having third and fourth current-carrying electrodes, and wherein said linearizer means includes:
   potential controller means, connected to said analog function generator circuit and to one of said third and fourth current-carrying electrodes of said second transistor, for causing a bias voltage applied to said one of said third and fourth current-carrying electrodes to vary in potential in response to an output of said analog function generator circuit.

15. The power amplifier device according to claim 12, wherein said linearizer means comprises:
   a resistor connected to said first amplifier;
   an analog function generation circuit having first and second input terminals connected to said resistor, and an output terminal; and
   voltage control means, having an input terminal connected to said output terminal of said analog function generation circuit and an output terminal connected to said second amplifier, for controlling a bias voltage of said second amplifier.

16. The power amplifier device according to claim 15, wherein said first amplifier includes a first transistor, and said second amplifier includes a second transistor.

17. The power amplifier device according to claim 16, wherein said first transistor has a gate electrode to which said input signal is applied, and a drain electrode connected to said resistor, and wherein said second transistor has a drain electrode connected to said voltage control means.

18. The power amplifier device according to claim 17, wherein said second transistor has a gate electrode connected to said drain electrode of said first transistor.

19. The power amplifier device according to claim 16, wherein said second transistor has a gate electrode at which a signal output from said first transistor arrives.

* * * * *